United States Patent
Glavish et al.

(10) Patent No.: US 8,723,135 B2
(45) Date of Patent: May 13, 2014

(54) ION BEAM BENDING MAGNET FOR A RIBBON-SHAPED ION BEAM

(75) Inventors: Hilton Frank Glavish, Incline Village, NV (US); Shojiro Dohi, Koka (JP); Benjamin Thomas King, Lower Hutt (NZ)

(73) Assignee: Nissin Ion Equipment Co., Ltd., Kyoto (JP)

( * ) Notice: Subject to any disclaimer, the term of this patent is extended or adjusted under 35 U.S.C. 154(b) by 253 days.

(21) Appl. No.: 13/438,424

(22) Filed: Apr. 3, 2012

(65) Prior Publication Data

US 2013/0256552 A1 Oct. 3, 2013

(51) Int. Cl.
*H01J 3/20* (2006.01)

(52) U.S. Cl.
USPC .............................. 250/396 R; 250/396 ML

(58) Field of Classification Search
None
See application file for complete search history.

(56) References Cited

U.S. PATENT DOCUMENTS

| | | | | |
|---|---|---|---|---|
| 5,483,129 A | * | 1/1996 | Yamamoto | 315/503 |
| 5,554,857 A | * | 9/1996 | Benveniste | 250/492.21 |
| 5,736,743 A | * | 4/1998 | Benveniste | 250/492.21 |
| 5,834,786 A | * | 11/1998 | White et al. | 250/492.21 |
| 7,078,714 B2 | * | 7/2006 | Maeno et al. | 250/492.21 |
| 7,112,789 B2 | * | 9/2006 | White et al. | 250/294 |
| 7,982,195 B2 | * | 7/2011 | Agarwal et al. | 250/492.21 |
| 2005/0258380 A1 | * | 11/2005 | White et al. | 250/492.21 |

FOREIGN PATENT DOCUMENTS

JP 3612106 B2 * 1/2005

* cited by examiner

*Primary Examiner* — Andrew Smyth
(74) *Attorney, Agent, or Firm* — Haynes and Boone, LLP

(57) ABSTRACT

An ion beam bending magnet provides a curved path through the magnet for bending a ribbon-shaped ion beam having its major cross-sectional dimension normal to the bending plane of the magnet. The magnet comprises a ferromagnetic yoke surrounding the beam path and having an internal profile in cross-section formed of four angled sides. These sides are angled to the major dimension of the ribbon beam passing through the magnet, so that the internal profile of the yoke is relatively wide in the center of the ribbon beam and relatively narrow near the top and bottom edges of the ribbon beam. Electrical conductors against the internal surfaces of the yoke provide a uniform distribution of electrical current per unit length along the angled sides of the profile, providing a substantially uniform magnetic bending field within the magnet yoke.

21 Claims, 14 Drawing Sheets

ION BEAM BENDING MAGNET FOR A RIBBON-SHAPED ION BEAM

BACKGROUND

1. Field of the Invention

The present invention relates to ion beam bending magnets and particularly such magnets adapted to accommodate and bend a ribbon-shaped ion beam having a cross-sectional profile with a major dimension normal to the bending plane of the magnet.

2. Background of the Invention

Magnets used for bending the path of an ion beam are known in various applications, especially in the field of ion implantation. One use of bending magnets in ion implantation is for filtering a beam of ions from an ion source, so as to produce a filtered beam comprising substantially only ions having a desired mass to charge ratio. As is well understood in this field, when a beam containing ions having a predetermined energy passes through a region of substantially homogenous magnetic field, transverse to the beam direction, the ions of the beam adopt curved paths having radii of curvature dependant on the mass charge ratio (m/q) of the individual ions. In this way, ions in the beam of differing m/q become spatially separated in a bending plane, so that unwanted ions can be filtered from the beam by passing the beam through a mass resolving slit. Mass analyzer magnets providing the required region of transverse homogenous magnetic field are well known in the field of ion implantation. In such mass analyzer magnets, the bending plane of the magnet is a plane normal to the direction of the homogeneous magnetic field.

It is also known, particularly in the field of ion implantation, to produce a ribbon-shaped ion beam having a cross-sectional profile which has a major dimension and a minor dimension. Ribbon-shaped ion beams may be used in ion implantation to provide a uniform implant dose over a substrate to be implanted, by providing relative scanning between the ribbon beam and the substrate in a single direction orthogonal to the major dimension of the ribbon beam. For this purpose, the major dimension of the ribbon beam at the implant location should extend right across the substrate. Known semi-conductor substrates for the fabrication of electronic devices comprise semi-conductor wafers with radii up to 300 mm.

Ion implantation is also used in the fabrication of flat panel displays, including for example LCD displays. In the case of the fabrication of flat panels for display devices, the panels to be implanted may have a transverse dimension of 800 mm or more. If such panels are to be implanted by means of a ribbon beam, then the major dimension of the ribbon beam needs to exceed the dimension of the panel to be implanted. It is important when implanting using a ribbon beam that the ribbon beam has excellent uniformity over the large dimension of the ribbon, so that substrate can be implanted uniformly by scanning the substrate through the ribbon beam transversely of the large dimension of the ribbon. This has led to implanters being manufactured in which a ribbon beam is extracted directly from the ion source and then transported to an implant station for implanting the desired substrate. Typically the ribbon-beam is passed through an analyzer magnet in order to select from the beam of ions extracted from the ion source substantially only ions of the desired mass required for implantation.

In the case of a ribbon beam, it is known to pass the ribbon beam through an analyzer magnet in which the magnetic field is directed parallel to the large dimension of the ribbon, with a view to bending the ribbon beam uniformly so that the required ions will pass through a mass resolving slit having the same long dimension as the major dimension of the ribbon beam. Providing a suitable uniform magnetic field over the full large dimension or width of the ribbon beam implies a magnetic pole spacing for the analyzer magnet which is sufficient to accommodate the large dimension of the ribbon beam. The resulting magnet can be extremely massive if the required magnetic field uniformity is to be obtained, both over the full gap of the magnetic poles, and for the required path length required to bend the ion beam to achieve a desired mass resolution. The difficulty of constructing a suitable analyzer magnet increases along with increases in the large dimension of the ribbon-beam to be analyzed.

Although the bending of a ribbon beam in a bending plane normal to the major dimension of the ribbon is discussed above in relation to mass analysis of the beam, ion beam bending magnets may be used for other purposes, including beam directional control, and beam scanning.

BRIEF SUMMARY OF THE INVENTION

According to the invention, an ion beam bending magnet has an ion beam inlet and an ion beam outlet and a curved path through the magnet for an ion beam. The curved path has a path length between the inlet and outlet and bends monotonically in an ion beam bending plane so as to have a curved central beam axis. The magnetic is adapted to accommodate and bend along this curved beam path a ribbon-shaped ion beam having a cross-sectional profile with a major dimension normal to the bending plane. The magnet comprises a ferromagnetic yoke surrounding the curved beam path along the path length. The ferromagnetic yoke has a uniform cross-sectional internal profile along the path length in respective planes normal to the curved central beam axis. This uniform cross-sectional internal profile is defined in Cartesian (x, y) co-ordinates having an origin at the central beam axis, an x-axis extending in the ion beam bending plane and a y-axis normal to the bending plane. The magnet further comprises electrical windings associated with the ferromagnetic yoke and arranged to generate a magnetic bending field within the yoke cross the curved path to bend a ribbon-shaped beam of ions having a desired mass/charge ratio along the curved path.

According to an aspect of the invention, the uniform cross-sectional internal profile has sides which include four angled sides respectively lying on lines defined by the four equations:

$$a_1 x + b_1 y = a_1 b_1, \quad\quad 1)$$

$$a_2 x - b_1 y = a_2 b_1, \quad\quad 2)$$

$$a_3 x + b_2 y = -a_3 b_2, \quad\quad 3)$$

$$a_4 x - b_2 y = -a_4 b_2; \quad\quad 4)$$

where $a_1$, $a_2$, $a_3$, $a_4$, $b_1$ and $b_2$ are positive numbers. Each of the angled sides which lie on the lines defined by equations 1) and 4) above extends on the respective said line at least to $y=y'$, and each of the two angled sides lying on the lines defined by equations 2) and 3) extends on the respective said line at least to $y=-y''$, where both $y'$ and $y''$ are positive.

BRIEF DESCRIPTION OF THE DRAWINGS

Embodiments of the invention will be described with reference to the following figures.

DETAILED DESCRIPTION OF THE EMBODIMENTS

Figure 1:
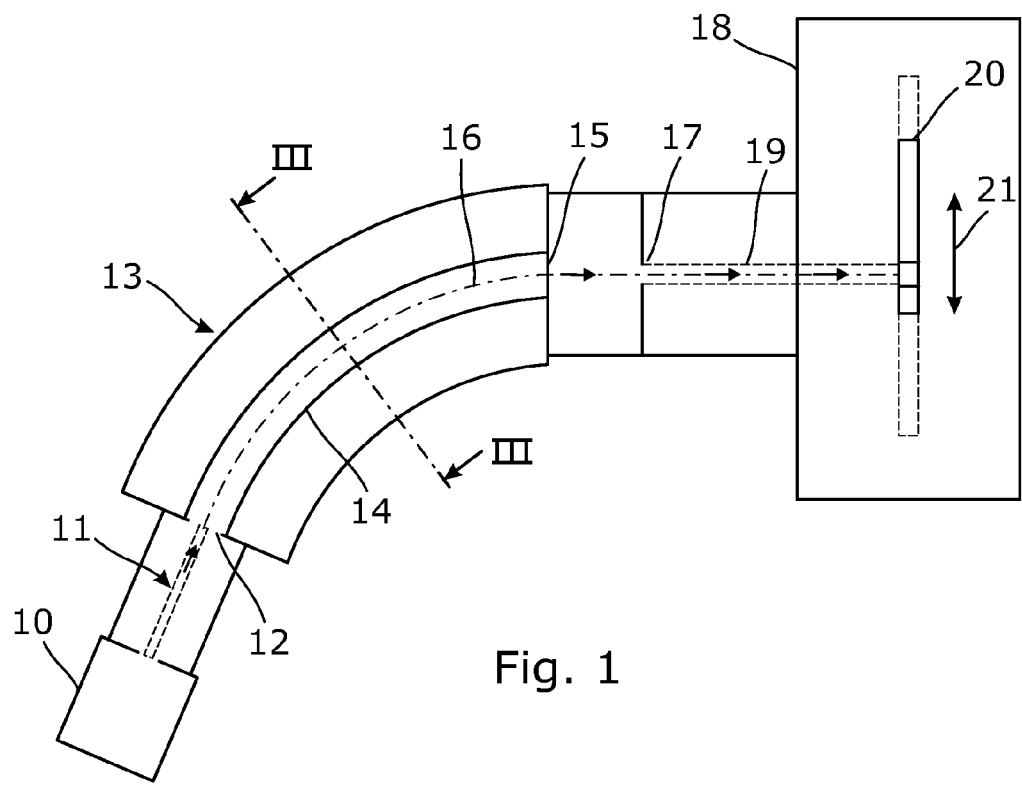
FIG. 1 is a schematic plan view of an ion implanter which may include an ion beam bending magnet embodying the present invention.

Ion beam bending magnets embodying the present invention may be used in the field of ion implantation, particularly in the implantation of relatively large flat panels for the production of flat panel display devices. FIG. 1 is a schematic diagram illustrating some of the essential components of an ion implanter incorporating an ion beam bending magnet embodying the present invention.

In FIG. 1 ions to be implanted are extracted from an ion source 10 to form an ion beam 11 which enters the inlet 12 of an ion beam bending magnet 13. Those skilled in the field of ion implantation will be familiar with various kinds of ion source which may be suitable for the ion source 10. In a typical ion source for use in this field a feed material comprising atoms or molecules of the ion species required for implantation are introduced into a chamber. Energy is delivered to the chamber, for example by means of an electric discharge, to form a plasma within the chamber containing ions of the desired species. A stream of ions is extracted through an aperture in a front plate of the chamber, by means of an electric field produced by suitably biased extraction electrodes. The extracted ions form an ion beam constituting the ion beam 11 in FIG. 1. Instead of an electric discharge to form the plasma in the ion source, other sources of energy may be used, such as microwave energy.

In FIG. 1, the ion beam bending magnet 13 comprises a mass analyzing magnet. Generally, ions in the ion beam 11 entering the magnet 13 at the inlet 12 have a predetermined ion energy, corresponding to the difference in electric potential between the plasma within the ion source 10 and the structure of the beam bending magnet. The magnet 13 has a beam channel 14 providing a curved path through the magnet for the ion beam 11, extending from the beam inlet 12 to a beam outlet 15. The curved path provided by the channel 14 bends monotonically in an ion beam bending plane, which is the plane of the paper in FIG. 1. The channel 14 also defines a curved central beam axis which is illustrated in FIG. 1 by the dashed line 16.

The ion beam bending magnet 13 is arranged to provide a substantially uniform magnetic field directed normal to the bending plane across the entire region of the beam channel 14. As a result, ions in the ion beam 11 entering the beam bending magnet 13 at the inlet 12 will follow a curved path along the channel 14, which has a radius of curvature corresponding to the mass/charge ratio of the ions of the beam. For ions in the beam from the ion source which have the same charge number, typically 1, the beam bending magnet is therefore effective to produce spatial separation, in the bending plane, between ions of different masses, as the ion beam leaves the magnet 13 at the outlet 15. Those ions in the beam 11 which have a mass charge ratio corresponding to the species of ion desired for implantation follow the curved path provided by the channel 14, substantially parallel to the curved central beam axis 16. Downstream of the outlet 15 of the magnet 13, a mass resolving slit 17 is located aligned with the central beam axis emerging from the magnet, so as to select only beam ions having the desired mass/charge ratio to pass through the slit 17 into a process chamber 18. Within the process chamber 18, the mass selected ion beam 19 of ions desired for implantation is directed at a substrate or panel 20 to be processed.

Figure 2:
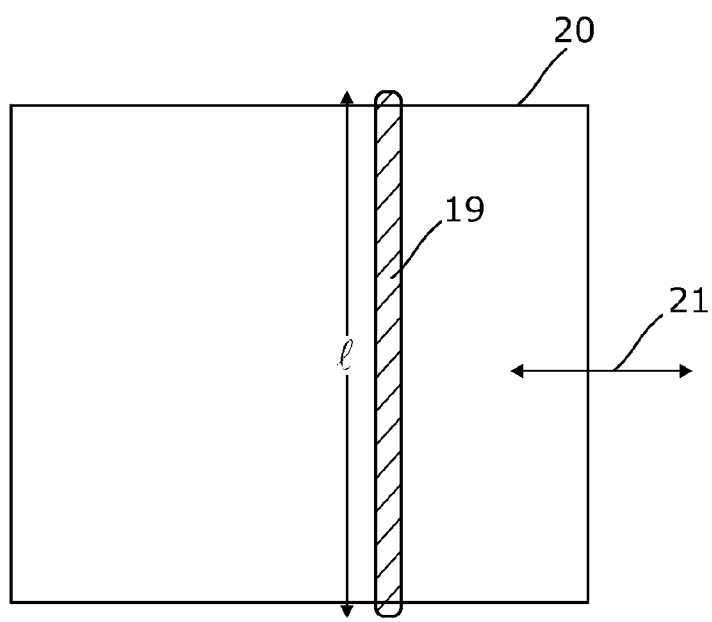
FIG. 2 is a schematic view, in the ion beam direction, of the footprint of a ribbon-shaped ion beam on a flat panel being implanted by the ion implanter of FIG. 1.

FIG. 2 is a view of the substrate or panel 20, within the process chamber 18, viewed along the mass selected ion beam 19. As shown in FIG. 2, ion beam 19 is ribbon-shaped having a cross-sectional profile with a major dimension e. The major dimension of the ribbon-shaped ion beam 19 is normal to the bending plane of the bending magnet 13. Therefore, only the minor dimension of the ion beam is shown in the view of FIG. 1.

In order to provide a uniform dose of implanted ions over the entire surface of the substrate or panel 20, the ion beam 19 impinging on the substrate or panel has a uniform linear intensity profile of ions over the major dimension l of the ion beam cross-section. The major dimension l of the ion beam cross-section is sufficient to extend right across a corresponding dimension of the substrate or panel 20 to be implanted, in the manner illustrated in FIG. 2. In addition, a mechanism (not shown for simplicity in FIGS. 1 and 2) is provided within the process chamber 18, to transport the wafer or panel 20 to and fro through the ribbon beam 19 in the direction of arrows 21, so that all parts of the substrate or panel 20 are exposed to the ion beam 19.

In the described arrangement, the ion beam 11 is extracted from the ion source 10 as a ribbon-shaped beam having its major dimension normal to the plane of the paper in FIG. 1. Accordingly, the bending magnet 13 is adapted to accommodate and bend along the curved path 16 a ribbon-shaped ion beam having a cross-sectional profile with a major dimension normal to the bending plane of the magnet. If the cross-sectional profile of the ribbon-shaped beam transported through the channel 14 of the ion beam bending magnet 13 has a major dimension of size h, then the channel 14 must have sufficient size normal to the bending plane of the magnet to accommodate this major dimension over the length of the curved beam path 16 through the magnet from the inlet 12 to the outlet 15. In order to bend the ion beam along the curved beam path 16 in the bending plane, the magnet 13 should provide a magnetic field normal to the bending plane between magnet poles which are spaced sufficiently apart to accommodate the major dimension h of the ribbon-shaped ion beam passing through the magnet. The flux density of the magnetic field should be substantially uniform between the poles over the full extent h of the major dimension of the ribbon-shaped ion beam, so that desired ions at all locations over the major dimension of the ribbon beam experience the same bending force. Further, the flux density between the magnetic poles should be substantially uniform over a sufficient distance transverse to the curved beam path, at all positions along the beam path, to accommodate the minor dimension of the ribbon-shaped beam of desired ions travelling along the curved path 16.

Figure 3:
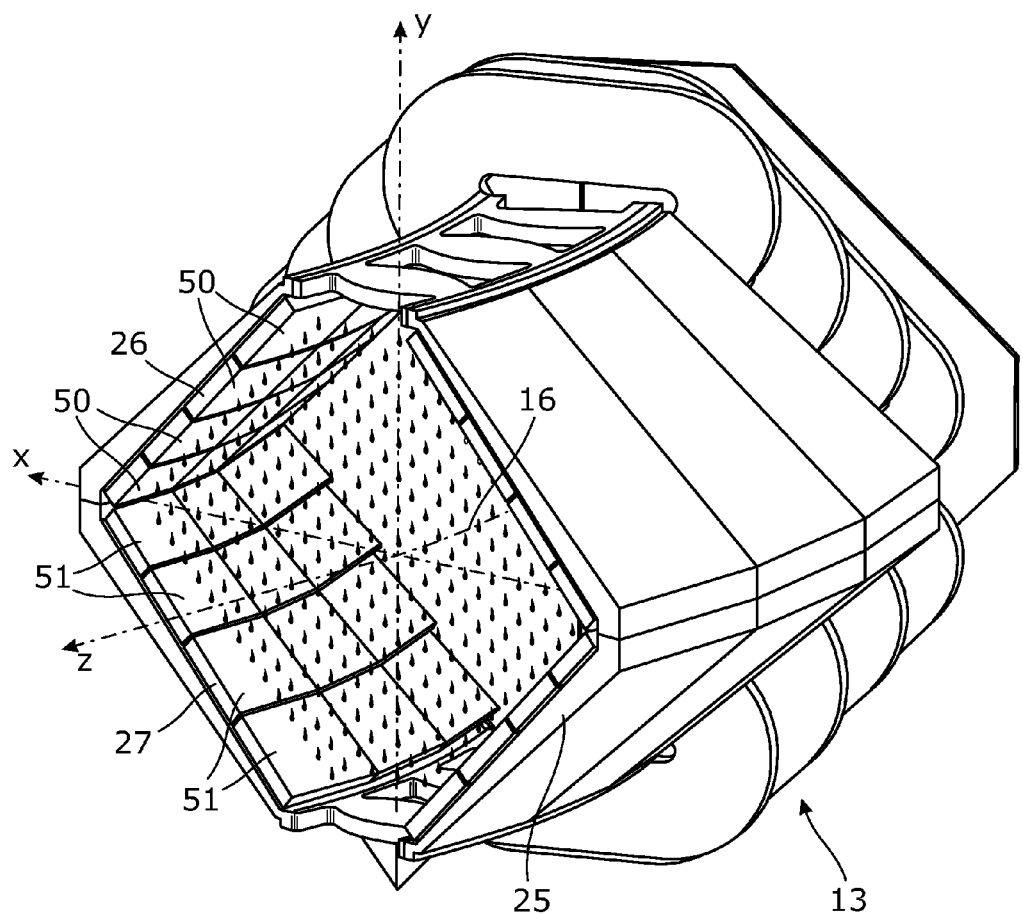
FIG. 3 is a perspective view of part of the bending magnet in the ion implanter of FIG. 1, with a cross-section taken along line III-III in FIG. 1.
Figure 4:
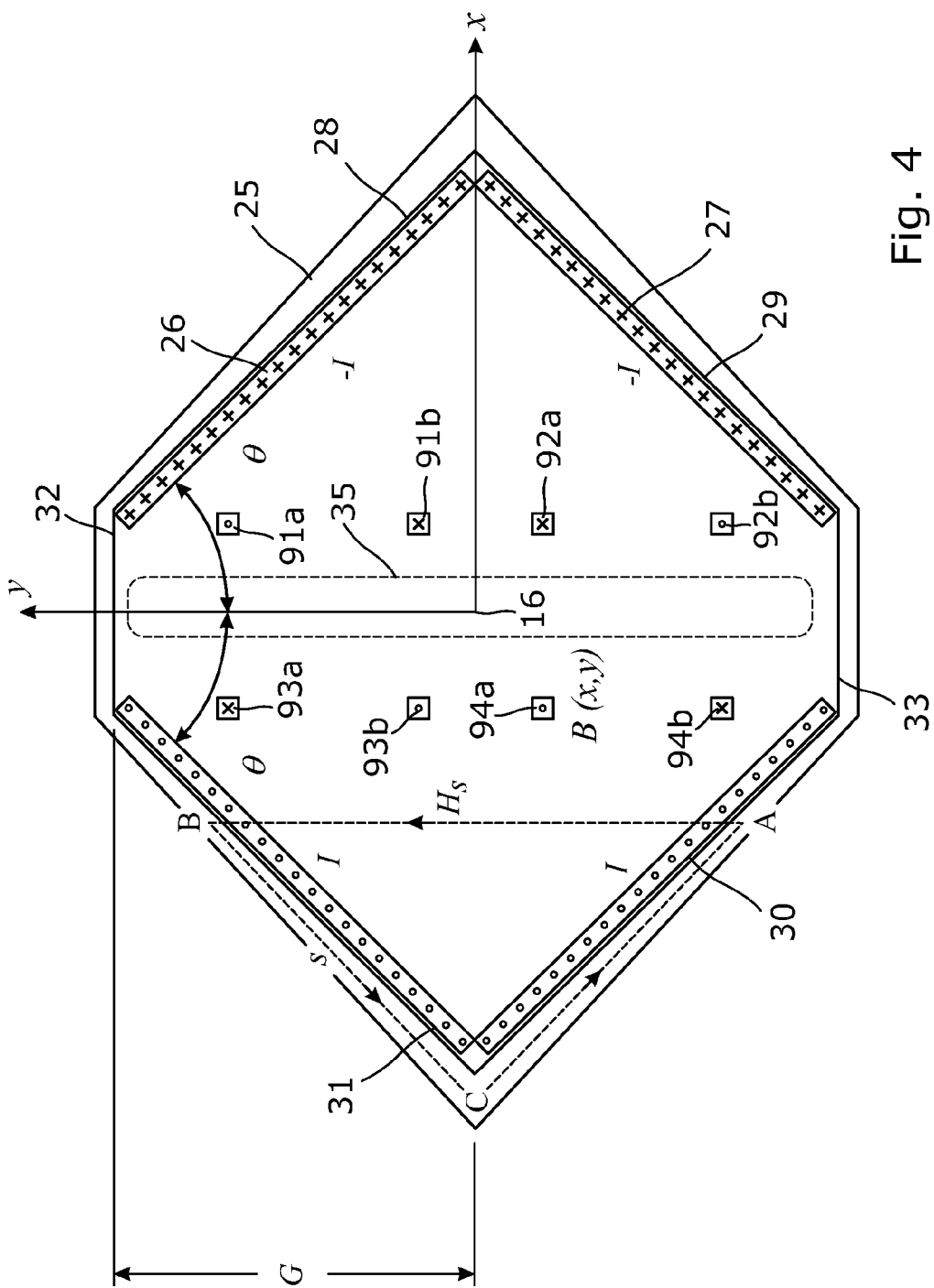
FIG. 4 is a schematic view of the cross-section of the ferromagnetic yoke and winding structure of the bending magnet of FIG. 3.

FIGS. 3 and 4 illustrate a design and structure of bending magnet embodying the present invention. FIG. 3 is a partial view of the ion beam magnet 13 showing a cross-section normal to the curved central beam axis 16 of the magnet 13, taken along the section line III-III in FIG. 1. FIG. 4 is a schematic sectional view across the magnet structure taken in the plane of the x, y co-ordinates illustrated in, FIG. 3, viewed along the direction of the co-ordinate z.

As shown in FIGS. 3 and 4, the ion beam bending magnet 13 comprises a ferromagnetic yoke 25 surrounding the curved beam path having the curved central beam axis 16 along the length of the path between the inlet and outlet of the magnet. The yoke 25 has a cross-sectional internal profile, defined by the internal surfaces of the yoke 25, which is substantially uniform along the length of the curved path through the magnet, in respective planes normal to the curved central beam axis 16. The cross-sectional internal profile in one such claim is as illustrated in FIG. 4 and is defined in the Cartesian x, y co-ordinates shown in FIGS. 3 and 4. These co-ordinates have an origin at the central beam axis 16, where the central beam axis intersects the respective plane of the cross-section. An x-axis of the co-ordinates extends in the ion beam bending plane which corresponds to the plane of curvature of the central beam axis 16. A y-axis of the x, y co-ordinates is normal to this bending plane.

The ion beam bending magnet 13 also has electrical windings 26 and 27 associated with the ferromagnetic yoke 25 and arranged such as to generate a magnetic bending field within the yoke across the curved path 16 to bend the ribbon-shaped beam of ions having the desired mass/charge ratio along the curved path. Further details of the design and arrangement of these electrical windings 26 and 27 will follow.

As can be seen in FIG. 4, the cross-sectional internal profile of the yoke 25 in this embodiment is symmetrical about the x and y axes. The internal profile is a six sided figure comprising four angled sides 28, 29, 30 and 31. In this example, the angled sides 28-31 all form the same angle θ to the y-axis. The angled sides 28 and 29 are on the radially inner side of the yoke relative to the curvature of the central beam axis 16, and the angled sides 30 and 31 are on the radially outer side of the yoke. In the example illustrated in FIG. 4, θ is 45°, so that the sides 28 and 29, and the sides 30 and 31 are at right angles to each other.

The windings 26 comprise conductors extending along the inner faces of the yoke corresponding to the angled sides 28 and 31. The conductors of winding 26 extend over the faces so as to be substantially parallel to the central axis 16. Similarly, winding 27 comprises conductors extending over the faces corresponding to angled sides 29 and 30 of the yoke. Again, the conductors of winding 27 extend substantially parallel to the central axis 16.

The conductors of the windings 26 and 27 are arranged to be distributed uniformly so as to provide a uniform number of said conductors per unit distance along each of the four sides 26, 27, 30 and 31. As a result, if each of the conductors carries the same current, there is a corresponding uniform current distribution per unit length along the sides 28, 29, 30 and 31.

As illustrated in FIG. 4, the direction of current flowing in the conductors of winding 26 distributed along the angled line 28 is opposed to the direction of current of the conductors distributed along line 31. Similarly, the direction of current of the conductors along line 29 of the yoke cross-sectional profile is opposed to the direction of current in the conductors distributed along the line 30. In the example illustrated in FIG. 4, the direction of current in the conductors along lines 28 and 29 is into the paper and the direction of current in the conductors along lines 30 and 31 is out of the paper.

The cross-sectional internal profile of the ferromagnetic yoke 25 has a top 32 and a bottom 33 in addition to the four angled sides 28, 29, 30 and 31. The top 32 and bottom 32 of the internal cross-sectional profile are parallel to the x-axis.

As will be explained, the structure of the ferromagnetic yoke 25 illustrated in FIG. 4, in combination with the electrical windings 26 and 27 as described, provide a magnetic field H directed parallel to the y-axis which has a flux density B which is substantially uniform over the internal volume of the yoke. The resulting beam bending magnet can accommodate a ribbon-shaped beam having a cross-sectional profile as illustrated at 35 in FIG. 4, having its major dimension aligned with the magnetic field within the magnet.

A conventional ion beam bending magnet in the prior art may comprise a pair of poles separated by a pole gap sufficient to accommodate the major dimension of the ribbon beam. The poles need to be of sufficient size to produce a substantially uniform flux density across the gap aligned with the major dimension of the ribbon, and over a sufficient distance either side of the central beam axis of the magnet to accommodate the minor dimension or width of the ribbon. The conventional magnet may include excitation coils surrounding iron cores that are physically connected to the magnet poles and have an external yoke interconnecting the two poles. A special form of ion beam bending magnet of this general kind is disclosed in U.S. Pat. No. 7,078,714, which is assigned to the Assignee hereof, and of which the disclosure is incorporated herein by reference in its entirety and for all purposes.

Whereas such a conventional magnet design may be satisfactory for a pole gap of say 800 mm in order to accommodate a ribbon beam having a major dimension less than 800 mm, scaling up the conventional design for larger ribbon beams creates significant practical problems. The resulting mass of the pole, yoke and coil structure of the conventional magnet may have to be increased more than three times, when scaling the pole gap by less than two times. By comparison, the structure of the bending magnet as illustrated in FIGS. 3 and 4 may allow upscaling as mentioned above without the attendant disproportionate increase in mass of the combined structure.

A further known problem with prior art ion beam bending magnets is the aberrations produced by the fringe fields at the inlet and outlet of the magnet. In the structure illustrated in FIGS. 3 and 4, only those conductors of the windings 26 and 27 close to the upper and lower ends of the angled sides 28, 29, 30 and 31, connecting to the top and bottom 32 and 33, are immediately adjacent the ribbon beam bending along the curved path within the magnet. As a result, aberrations caused by fringe fields are primarily confined to the upper and lower edges of the ribbon beam.

Another beam bending magnet structure known in the prior art is the so-called window frame magnet described in U.S.

Pat. No. 7,112,789 to White et al. In this structure, conductors of the excitation winding are located adjacent the ribbon beam substantially over the full width of the ribbon beam so that the whole ribbon beam may experience aberrations from fringing fields at the entry and exit of the magnet.

Referring to FIG. 4, the magnetic properties of the illustrated magnet can be derived from Amperes law $$\int_c H_s \cdot ds = i. \qquad 1.$$

In words, the equation states that the line integral of the magnetic field $H_s$ along a closed path s is equal to the total current i enclosed by the path.

Referring to FIG. 4, a closed path s is illustrated from A→B→C→A. Therefore, according to Ampères law, $$\int_{A \to B} \frac{1}{\mu_0} B_y(x, y) dy + \int_{B \to C \to A} \frac{1}{\mu_s} B_s \cdot ds = i. \qquad 2$$

In equation 2, the magnetic field H has been expressed in terms of the flux density B and the magnetic permeability μ of the respective material, according to the expression $$H = \frac{1}{\mu} B \qquad 3$$

Referring to equation 2, the first term is the line integral of the magnetic field in the working gap of the magnet, where magnetic permeability is $\mu_0$, and the second term is the line integral of the magnetic field in the ferromagnetic yoke 25, for which the magnetic permeability is $\mu_s$. For a ferromagnetic yoke material such as low carbon steel $\mu_s >> \mu_0$, so that the second term is much smaller than the first. Equation 2 then simplifies to $$\int_{A \to B} \frac{1}{\mu_0} B_y(x, y) dy = i. \qquad 4$$

As explained above, the coil windings 26 and 27 for the magnet contain a constant number of conductors per unit distance along each of the angled lines 28, 29, and 31 of the internal profile of the yoke. Assuming these conductors receive the same current, it can be seen that this arrangement provides a constant current of j amps per unit length along the angled lines of the yoke profile.

Referring to FIG. 4, which is symmetrical about the x-axis, if the spacing or gap between the top 32 and bottom 33 is 2G, then $$j = \frac{I \cos \theta}{G} \qquad 5$$

where the total current flowing in the conductors adjacent line 31 of the yoke profile is I, and the total current flowing in the conductors adjacent face 28 of the yoke profile is −I. Equation 4 then becomes $$\int_{-y}^{y} B_y(x, y') dy' = 2\mu_0 j \frac{y}{\cos \theta}. \qquad 6$$

Because the yoke structure is symmetrical in FIG. 4 about the x-axis, $B_y(x,y)$ is also symmetrical, so that the only possible solution for equation 6, after substituting j from equation 5, is $$B_y(x, y) = \frac{2\mu_0 I}{G}. \qquad 7$$

This shows that $B_y$ is independent of x and y and is therefore constant throughout the working gap of the magnet within the yoke 25.

Considering the flux density component $B_x$, a closed integration path including a line integral across the working gap in the x direction, would enclose zero net current, as the contribution from the conductors adjacent line 31 of the yoke profile is opposed by the contribution from the conductors adjacent line 28 of the profile.

As a result, the equivalent of equation 6 along the x-axis becomes:

$$\int_{-x}^{x} B_x(x', y) dx' = 0. \qquad 8$$

The only possible solution is $$B_x(x,y)=0. \qquad 9$$

The combination of equations 7 and 9 prove that the flux density in the space enclosed by the yoke 25 illustrated in FIG. 4 is uniform throughout the space and has a y direction.

Figure 5:
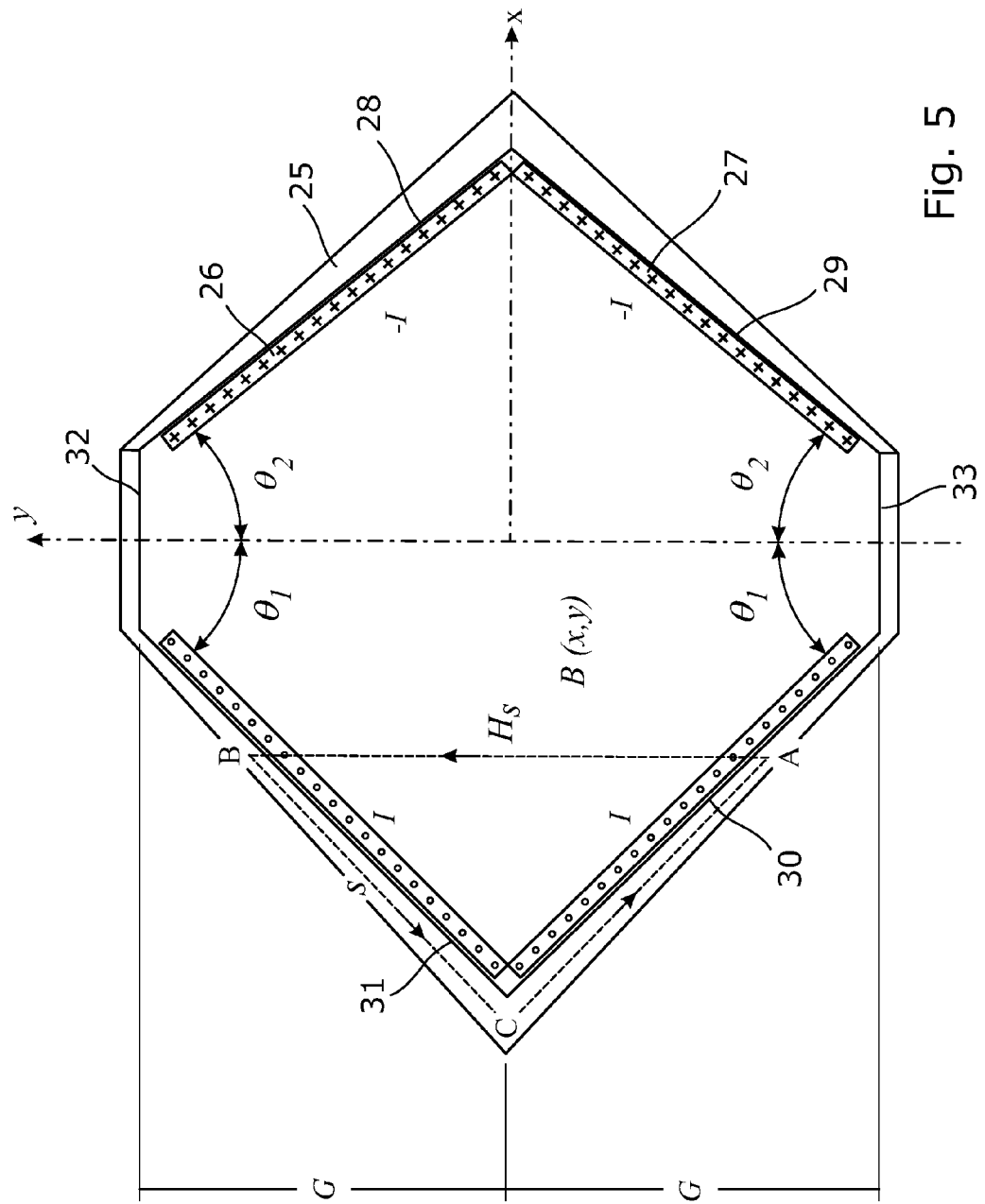
FIGS. 5 and 6 are alternative embodiments of the yoke structure of FIG. 4.

It has also been demonstrated that this is true independently of the value of angle θ. It can also been seen, therefore, that the yoke profile need not be symmetrical about the y-axis, so that the angle to the y-axis of the angled lines 31 and 30 of the yoke profile may be different to the angle to the y-axis of the angled lines 28 and 29. This is illustrated in FIG. 5 in which the angle between the angled lines 30 and 31 and the y-axis is shown as $\theta_1$ and the angle between the angled lines 28 and 29 and the y-axis is shown as $\theta_2$. The windings must however be arranged to provide the same current (−I) in total along conductors adjacent faces 28 and 29, as the current (I) along the conductors adjacent the lines 30 and 31.

Figure 6:
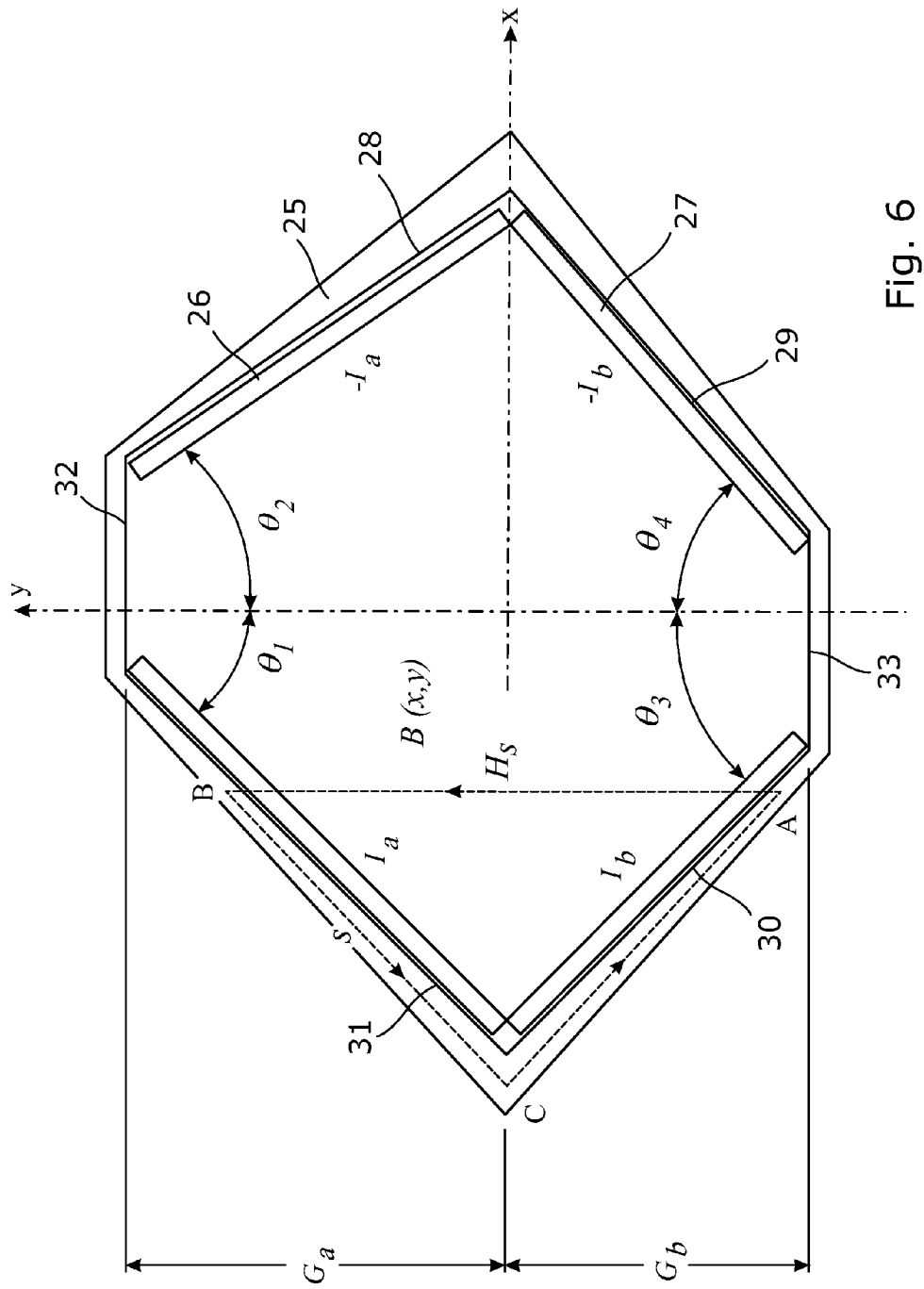

Also the yoke structure need not be symmetrical about the x-axis. This is illustrated in FIG. 6, in which the angle between the angled line 30 and the y-axis ($\theta_3$) is different from the angle between the angled line 31 and the y-axis ($\theta_1$), and also the angle between the angled line 29 and the y-axis ($\theta_4$) is different from the angle in between the angled line 28 and the y-axis ($\theta_2$). However, in order for B(x, y) to be uniform and directed in the y direction, throughout the internal volume of the yoke profile, the current magnitude provided by the conductors adjacent the angled sides 29 and 30 (below the x-axis in FIG. 6) should be adjusted to produce the same magnetic field ($B_y$) at positions along the x-axis (y=0) as is produced by the current magnitude per unit length provided by the conductors adjacent the angled sides 28 and 31 (above the x-axis in FIG. 6).

Also, in order to maintain magnetic field uniformity within the volume enclosed by the yoke, the angled side 28 should intersect the angled side 29 at the same y location as the angled side 31 intersects the angled side 30. In FIG. 6, the two intersection points of the angled sides are both on the x-axis (y=0).

If the total current provided by the conductors adjacent each of sides 28 and 31 is $I_a$, and the total current provided by the conductors adjacent the angled sides 29 and 30 is $I_b$, then uniform magnetic field is provided within the yoke if $$\frac{I_b}{I_a} = \frac{G_b}{G_a}, \quad 10)$$

Where $G_a$ is the gap distance from the x-axis to the top 32 of the internal yoke profile, and $G_b$ is the gap distance from the x-axis to the bottom 33 of the internal yoke profile.

Although an ion beam bending magnet can be constructed to provide a uniform gap field with an internal yoke profile which is asymmetric about both the x and y axes, as illustrated in FIG. 6, this asymmetry will result in correspondingly asymmetric fringing fields at the inlet and outlet of the magnet, which may produce undesirable asymmetrical aberrations in the distribution of the ions in the ribbon-shaped ion beam emerging from the outlet of the magnet. A yoke structure which is symmetrical about the x-axis eliminates such asymmetric aberrations associated with the fringing fields at the inlet and outlet of the magnet. It may also be more difficult to manufacture the coil windings suitable for a yoke cross-sectional profile which is asymmetric about the y-axis, so that a doubly symmetric cross-sectional yoke profile, as illustrated in FIG. 4, can be desirable.

Figure 7:
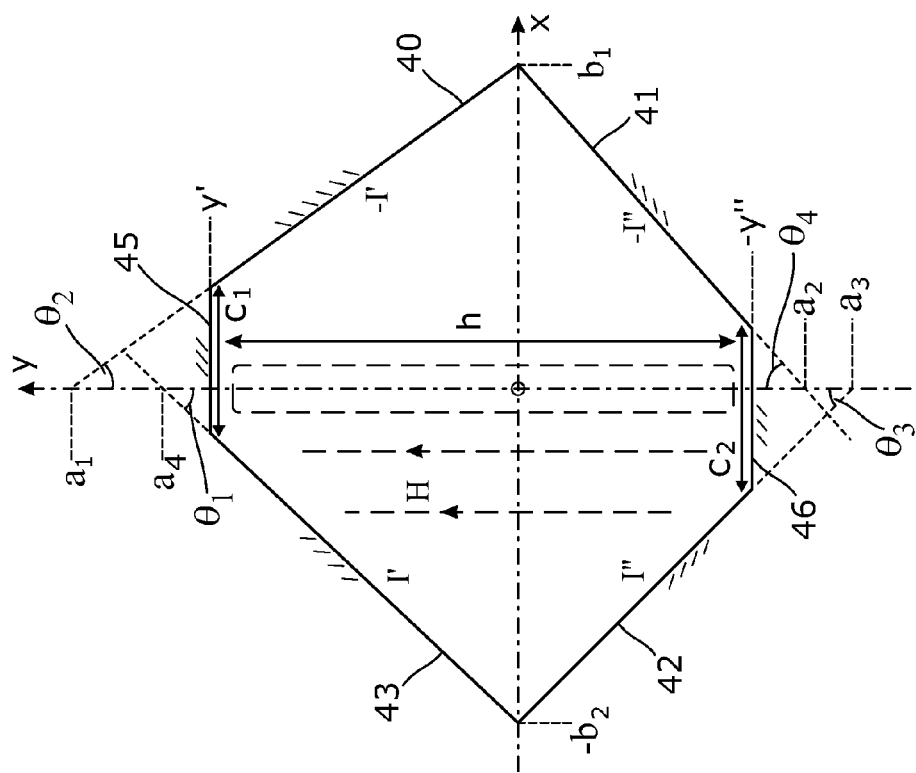

Nevertheless, it is certainly possible to manufacture ion beam bending magnets with a ferromagnetic yoke structure for which the uniform cross-sectional internal profile of the yoke is asymmetric about both of the x and y axes, for example as illustrated in FIG. 6. The geometry of such an internal cross-sectional profile for the yoke is illustrated in more detail in FIG. 7. The cross-sectional internal profile is shown in FIG. 7 as having four angled sides 40, 41, 42 and 43, together with a top 45 and a bottom 46, defining a closed hexagonal figure as illustrated. As illustrated in FIG. 7 on the Cartesian x, y co-ordinates in the Figure, the four angled sides 40, 41, 42 and 43 respectively lie on lines defined by the four equations:

$$a_1 x + b_1 y = a_1 b_1, \quad 1)$$

$$a_2 x - b_1 y = a_2 b_1, \quad 2)$$

$$a_3 x + b_2 y = -a_3 b_2, \quad 3)$$

$$a_4 x - b_2 y = -a_4 b_2; \quad 4)$$

where $a_1$, $a_2$, $a_3$, $a_4$, $b_1$ and $b_2$ are positive numbers.

As illustrated in FIG. 7, the top 45 of the yoke profile is on a line parallel to the x-axis at a position $y=y'$, and the bottom 56 lies on a line parallel to the x-axis at $y=-y''$. Accordingly, the angled sides 40 and 43, lying on the lines defined by equations 1 and 4 above extend on the respective line up to the position $y=y'$. Correspondingly, the angled sides 41 and 42 lying on the lines defined by equations 2 and 3 above extend on the respective said line down to a position $y=-y''$. Both $y'$ and $y''$ are positive. $y'$ is less than the smaller of $a_1$ and $a_4$, so that the top 45 of the profile extends right across the y-axis. In a similar fashion, $y''$ is less than the smaller of $a_2$ and $a_3$, so that the bottom 46 of the profile also extends right across the y-axis.

In order to accommodate, between the top 45 and bottom 46 of the yoke profile, a ribbon-shaped beam having a major dimension H aligned with the y-axis, $y'+y''$ should be greater than H. The ion beam bending magnet further includes electrical windings associated with the ferromagnetic yoke and arranged to generate the magnetic bending field within the yoke across the curved path to bend the ribbon-shaped beam of ions having a desired mass/charge ratio along the curved path.

The ferromagnetic yoke 25 (FIGS. 3, 4, 5 and 6) has four internal surfaces which respectively correspond to the four angled sides of the uniform cross-sectional internal profile of the yoke. The electrical windings 26 and 27 comprise axial conductor elements extending adjacent the internal surfaces of the yoke, parallel to the curved central beam axis, between the inlet and the outlet of the magnetic. Blocks of these axial conductor elements are illustrated schematically at 50 and 51 in FIG. 3. The conductor elements 50 and 51 are arranged to provide a uniform number of said conductors per unit distance along each of the four angled sides of the cross-sectional profile. Referring again to FIG. 7, the total of the current in the conductors distributed along the sides 40 and 43 of the cross-sectional profile, above the x-axis, is $I'$. The current ($I'$) flowing in the conductors adjacent the angled side 43 is in the opposite direction to the total current $-I'$ flowing in the conductors along the side 40. Similarly, the total of the uniformly distributed current flowing along the side 42, below the x-axis, is $I''$ and the total of the uniformly distributed current flowing along the angled side 41 below the x-axis is $-I''$.

In order to provide the required uniform magnetic field H throughout the interior space defined by the internal profile of the ferromagnetic yoke, $HI''=y'/y''$.

Referring again to FIG. 7, it can be seen that $$b_2/a_4 = \tan \theta_1,$$

$$b_1/a_1 = \tan \theta_2,$$

$$b_2/a_3 = \tan \theta_3,$$

and $b_1/a_2 = \tan \theta_4$.

Generally, each of $\theta_1$, $\theta_2$, $\theta_3$ and $\theta_4$ may be greater than or equal to 20° and less than or equal to 60°. For angles less than about 20°, the advantages of the angled side yoke profile are much reduced, and for angles greater than about 60°, the yoke structure becomes heavier with little additional advantage.

In the FIG. 7 arrangement, the top 45 has a dimension $c_1$ in the plane of the illustrated cross-sectional profile. The bottom 46 of the profile has a corresponding dimension $c_2$. In a preferred embodiment each of $c_1$ and $c_2$ is less than or equal to $(b_1+b_2)/2$. In a further embodiment each of $c_1$ and $c_2$ is less than or equal to $(b_1+b_2)/4$.

Once $c_1$ and/or $c_2$ reach the size of $(b_1+b_2)/2$, the advantages of the invention are much diminished.

Figure 8:
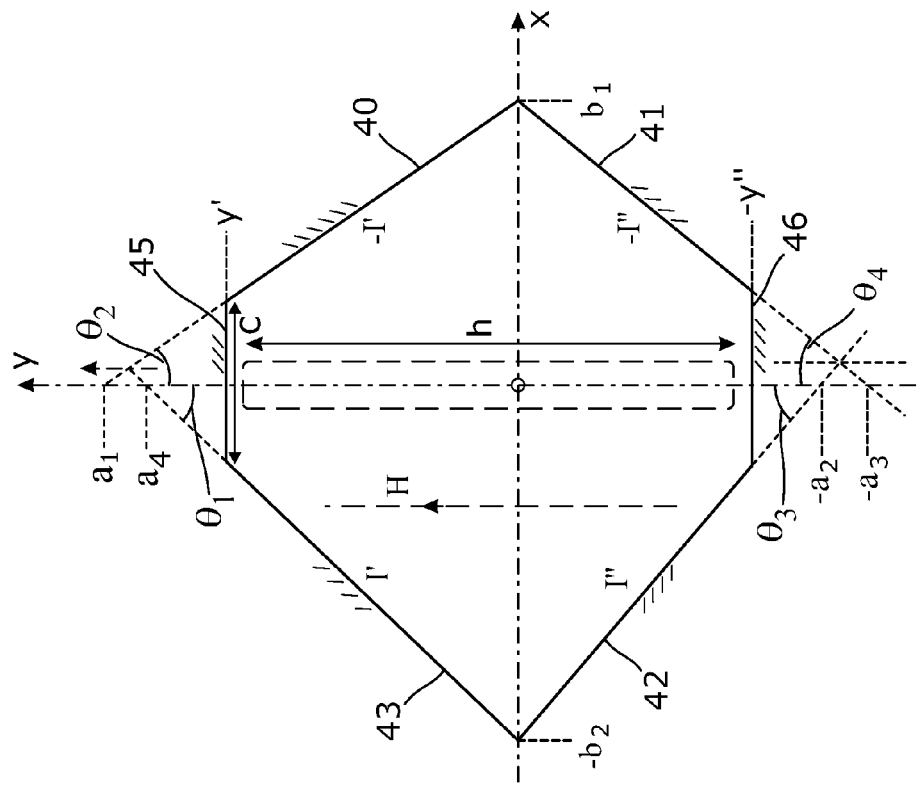
FIGS. 7, 8, 9 and 10 are schematic representations of various forms of yoke structure embodying the present invention.

Referring now to FIG. 8, this illustrates a particular case for the fully asymmetric example of FIG. 7, in which $\tan \theta_1/\tan \theta_3 = \tan \theta_2/\tan \theta_4$. This limitation may also be expressed in the form $a_1 \cdot a_3 = a_2 \cdot a_4$. With this limitation, the top 45 and bottom 46 of the internal yoke profile may be substantially aligned relative to the y-axis, compared to the skewing evident in FIG. 7. As a result, sufficient space and field uniformity for a ribbon-shaped beam of finite thickness can more readily be provided.

Figure 9:
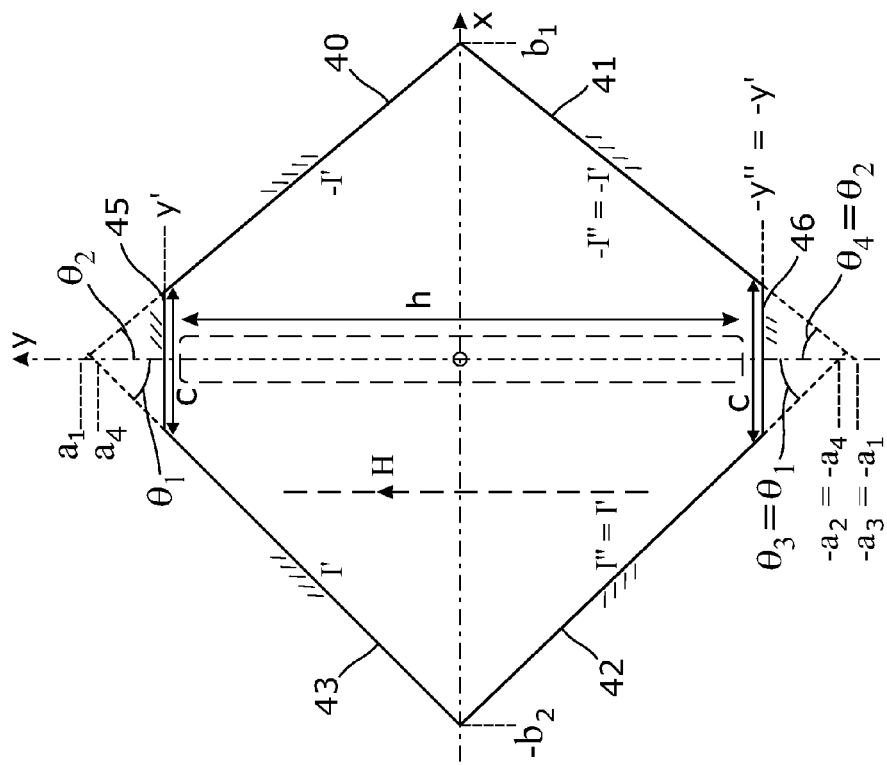

Referring now to FIG. 9, the illustrated internal yoke profile is symmetrical about the x-axis, whereby $\theta_4$ is now equal to $\theta_2$ and $\theta_3$ is now equal to $\theta_1$. As a result, $a_2=a_4$ and $a_3=a_1$. The position of the top 45 and bottom 46 can also be symmetrical so that $y''=y'$. Accordingly, $c_1$ also equals $c_2$ (identified simply as c in FIG. 9). Because $y'=y''$, the total current distributed along the sides 40 and 41 is also now equal $(-I')$ and the total currents distributed along each of the sides 43 and 42 is also equal $(I')$.

Figure 10:
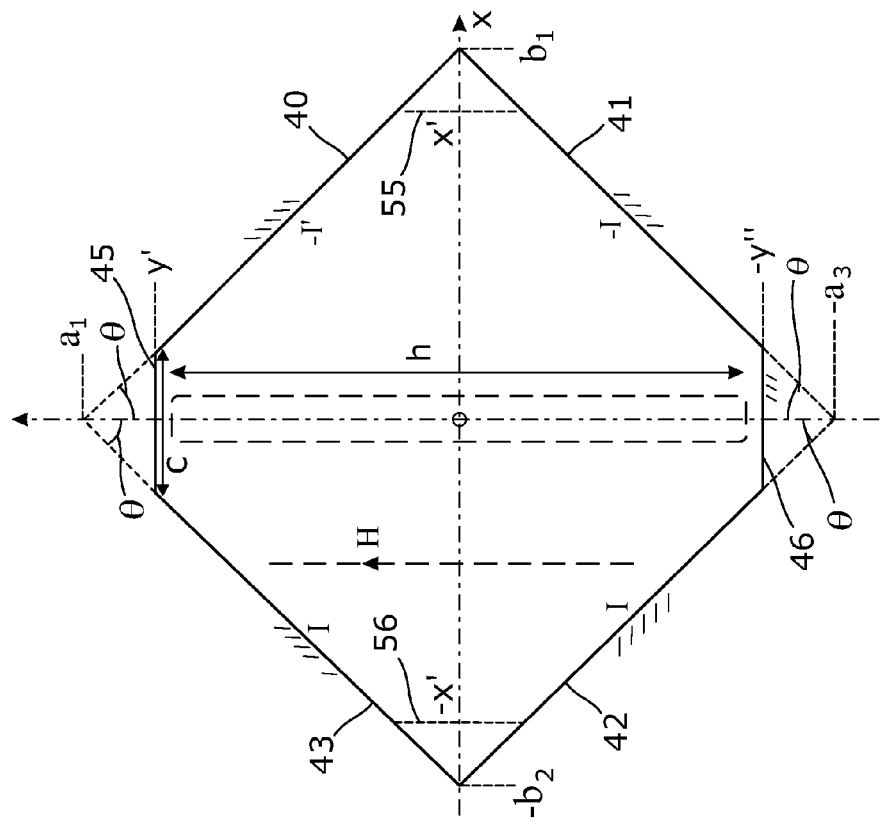

Finally, FIG. 10 illustrates the fully symmetric arrangement corresponding to FIG. 4, in which $\theta_1=\theta_2=\theta_3=\theta_4$ (all simply denoted θ in FIG. 10). FIG. 10 also illustrates the embodiment in which θ=45°.

Referring again to FIG. 4, the yoke 25 comprises four angled faces corresponding to the angled sides 28, 29, 30 and 31 of the cross-sectional profile illustrated. Each of the four sides of the uniform cross-sectional internal profile of the yoke 25 extends between a respective waist end where |x| is a maximum and |y| is a minimum and a respective apex end where |x| is a minimum and |y| is a maximum. As can be seen in FIG. 4, the yoke 25 has a cross-sectional thickness, normal to the respective angled internal surface, which reduces from a maximum at said waist ends of said sides to a minimum at said apex ends of said sides. The thickness variation may be linear. The increasing thickness of ferromagnetic yoke 25 towards the waist ends of the angled lines 28, 29, 30 and 31 is effective to accommodate the increasing internal magnetic flux within the yoke towards the waist region (where y=0) of the magnet. By reducing the thickness of the magnetic yoke 25 towards the apex ends of the angled sides, where the magnetic flux to be accommodated by the yoke is less, the overall weight of the magnet can be reduced.

The FIG. 4 embodiment is symmetrical about both x and y axes. The thickness of the yoke 25 may also be tapered towards the apexes of the angled lines of the internal profile of the yoke, in the case of asymmetric yoke structures such as illustrated in FIGS. 5 and 6.

Figure 11:
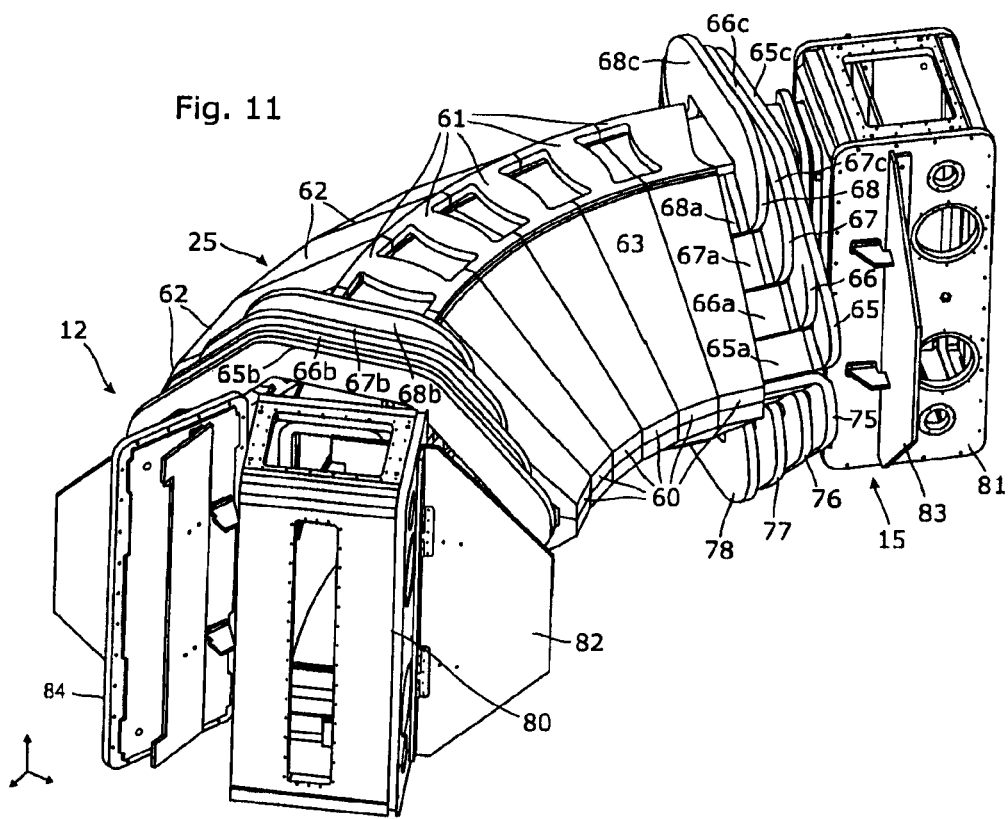
FIG. 11 is a perspective view of a bending magnet embodying the present invention.
Figure 12:
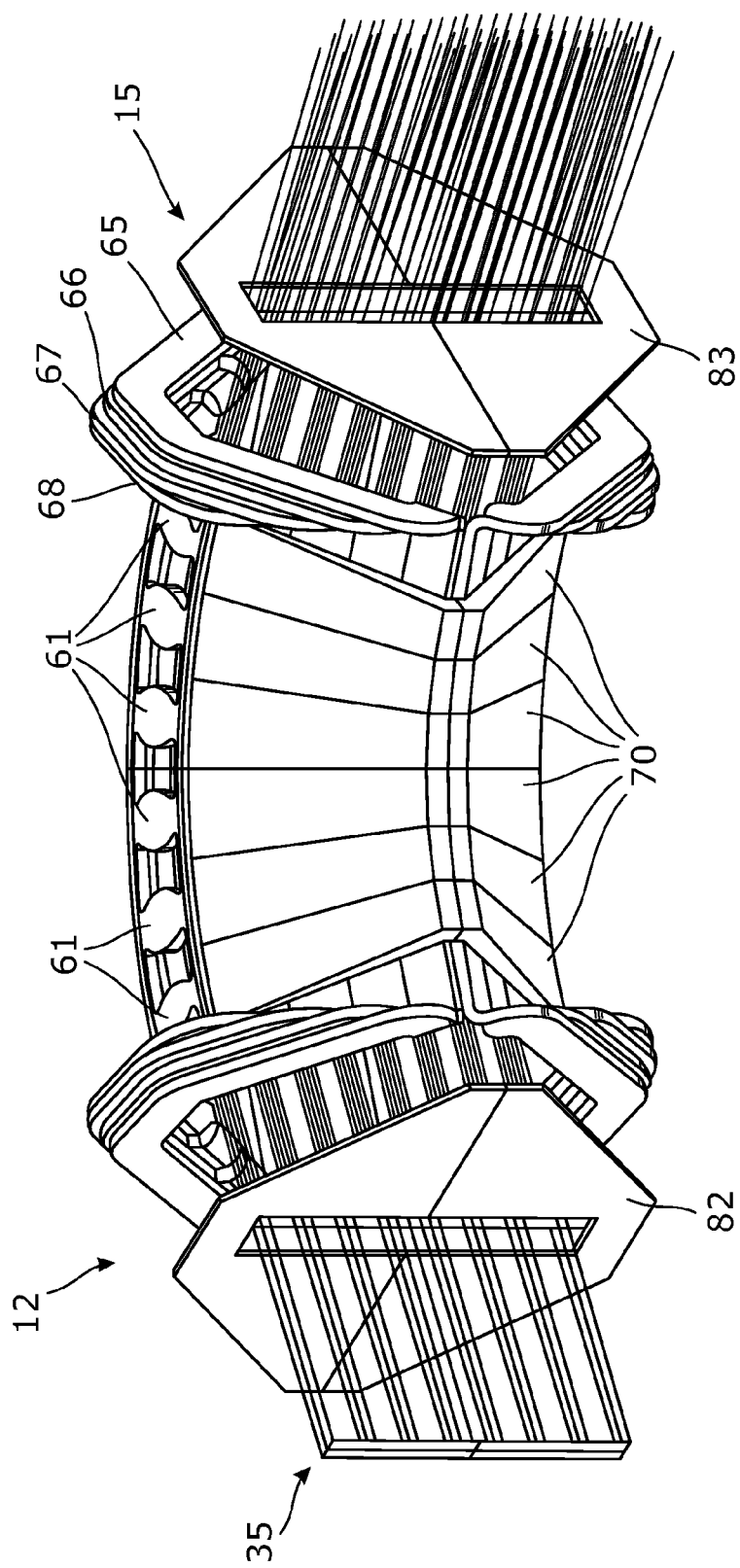
FIG. 12 is a further view of the bending magnet of FIG. 11.

FIGS. 11 and 12 illustrate an embodiment of ion beam bending magnet in greater detail. The embodiment illustrated corresponds to the symmetrical structure of FIG. 4, in which the ferromagnetic yoke has an internal profile with angled sides at 45° to the y-axis.

In FIGS. 11 and 12, the ferromagnetic yoke is formed of six segments 60 which fit together to accommodate the required curved path for the ion beam through the magnet. The yoke 25 also has six top plates 61 interconnecting the inner angled yoke segments 60 with corresponding outer segments 62. The top plates 61 provide inner surfaces corresponding to the top 32 of the yoke internal profile illustrated in FIG. 4. As shown in FIG. 11, the top plates 61 are each formed as segments of an annulus, in order to adopt the required magnet curvature. Bottom plates similar to the top plate 61 are provided to interconnect corresponding lower angled yoke segments and to provide a yoke surface corresponding to the bottom line 33 of the internal profile illustrated in FIG. 4.

The top plate 61, and also the bottom plates not shown in FIG. 11 or 12, are specially shaped to provide better control of aberrations to the upper and lower edges of a ribbon beam passing through the magnet. Cut-outs 63 through the top plate segments 61 are effected to modify the magnetic field produced near the upper edge of the ribbon beam 35 (see FIG. 4) in order to counteract aberrations. Similar cut-outs are provided in the bottom plates of the magnet which cannot be seen in FIG. 11.

The coil windings 26 and 27 (FIG. 4) are provided by saddle coil units which can be seen in FIGS. 11 at 65, 75, 66, 76, 67, 77 and 68, 78. Each of saddle coil units 65, 66, 67 and 68 form a part of the coil winding 26 of FIG. 4. Each of saddle coil units 75, 76, 77 and 78 form a part of the coil winding 27 in FIG. 4. Accordingly, saddle coil units 65 and 75 form a pair. Similarly, units 66 and 76, units 67 and 77 and units 68 and 78 form respective pairs.

Each saddle coil unit comprises a first plurality of axial conductor elements arranged side by side in a first axial row parallel to a first one of the angled internal yoke surfaces which is inside the curved beam path. In the case of the saddle coil unit 65, the first plurality of axial conductor elements arranged side by side is indicated at 65a in FIG. 11. Similarly, the first plurality of axial conductor elements for saddle coil units 66, 67 and 68 are indicated as 66a, 67a and 68a. The saddle coil units 75, 76, 77 and 78 corresponding to the lower coil unit 27 (FIG. 4) have corresponding first pluralities of axial conductor elements. The axial conductor elements in each of these pluralities of elements identified above, are uniformly spaced so as to provide a uniform number of the conductor elements per unit distance along the angled lines of the uniform cross-sectional profile of the yoke 25.

Each of the yoke units comprises a second plurality of axial conductor elements arranged side by side in a second axial row parallel to a second one of the angled internal yoke surfaces which is outside the curved beam path. This second plurality of axial conductor elements for each of the saddle units provides the return path for current flowing around the saddle coil unit on the other side of the y-axis of the yoke, which is the radially outer side of the yoke relative to the curved beam path. Each of the saddle units also includes a first plurality, 65b, 66b, 67b and 68b of linking conductor elements connecting the axial conductor elements of the first and second axial rows adjacent the inlet of the magnet. Correspondingly, each saddle coil unit has a second plurality 65c, 66c, 67c and 68c of linking conductor elements connecting the axial conductor elements of the first and second axial rows adjacent the outlet of the magnet.

In the case of each of the saddle units, the linking conductor elements 65b, 66b, 67b and 68b of the first plurality are arranged side by side in a first radial row which lies in a respective first radial plane normal to the central beam axis at the inlet of the magnet. Similarly, the linking conductor elements 65c, 66c, 67c and 68c of the second plurality for each of the saddle coil units are arranged side by side in a second radial row which lies in a respective second radial plane normal to the central beam axis at the outlet of the magnet.

As can be seen in FIGS. 11 and 12 when considering each of the saddle coil units, each of the axial conductor elements in each of the first and second axial rows 65a, 66a, 67a and 68a bends outwards through 90° perpendicularly to the respective adjacent one of the first and second angled internal yoke surfaces, to connect to a respective one of the linking conductor elements 65c to 68c or 65b to 68b.

In the embodiment described, the electric windings 26 and 27 (FIG. 4) comprise a plurality of pairs of the saddle coil unit 65 and 75, 66 and 76, 67 and 77 and 68 and 78. Respective rows of the axial conductors of the pairs of saddle coil units extend over respective parts of each of the angled internal yoke surfaces. Thus, the rows 65a, 66a, 67a and 68a of axial conductor elements provided by the four upper saddle coil units 65, 66, 67 and 68 abut each other so as together to provide the complete upper coil winding 26 extending parallel to the upper inner angled face of the yoke 25.

As can be seen in FIG. 11, the radial rows 65c, 66c, 67c and 68c of the upper saddle coil units are arranged to nest one inside the other, so that the row 65a of the axial conductor elements of the outer nesting saddle coil unit 65 is longer than the axial row 66a of the next saddle coil unit 66, which is in turn longer than the row 67a of the saddle coil unit 67 which is again in turn longer than the uppermost row 68a of the saddle coil unit 68. This structure is of course repeated for the lower saddle coil units 75, 76, 77 and 78.

There are a number of advantages with this structure for the windings of the ion beam bending magnet described. Firstly, the total winding structure for the magnet is divided up into multiple parts which can substantially ease manufacturing and assembly. Also, because the radial rows 65b-68b and 65c-68c of linking conductors for each saddle coil unit are nested together, the total radial dimension of the radial rows is reduced and the overall length of conductor required is also reduced. As mentioned above, although the nesting structure requires the rows of axial conductors towards the waist of the magnet, e.g. 65a and 66a, to extend to be beyond the end of the yoke structure at the inlet and outlet of the magnet, the increasing fringing fields caused by these longer axial conductors are well spaced from the ion beam which is located close to the y-axis as seen in FIG. 4, so that aberrations caused by these extended axial conductors 65a and 66a are minimal.

The number of turns of conductor used to form each of the saddle coil units 65, 66, 67 and 68 may be adjusted in order to minimize the overall difference in length of conductor in each of the saddle coil units. For example, the number of turns in the saddle coil units between the outer most nesting unit 65 and the inner most nesting unit 68 may progressively increase. As a result, because the conductor spacing in the axial rows of conductors 65a, 66a, 67a and 68a is uniform over whole winding, the width of the rows of conductor elements also increases from row 65a to row 68a. By keeping the overall length of conductor in each of the saddle coil elements substantially the same, losses for each of the saddle coil units can be kept substantially uniform. The conductor elements in each of the saddle coil units are water cooled tubular elements.

The turns of each of the saddle coil units 65, 66, 67 and 68 may be connected in series to a single power supply to drive the required current. However, it may also be desirable to drive the saddle coils 65, 66, 67 and 68 (or at least some of them) independently from separate power supplies. Generally, it can be understood that the currents in the lower saddle coils 75-78 should correspond to the currents in the upper saddle coils 65-68, in order to provide the required uniform magnetic bending field within the magnet.

Referring to FIG. 12, corresponding parts of the bending magnet have been given the same reference numerals. The view of FIG. 12 shows the lower yoke segments which would provide the inner angled faces corresponding to the angled line 29 of the yoke internal profile of FIG. 4. These lower yoke segments are identified in FIG. 12 by the reference numeral 70. In FIG. 12, the ribbon beam 35 is shown entering the inlet 12 of the magnet and exiting at the outlet 15 of the magnet. FIG. 11 shows an entry manifold 80 at the inlet to the magnet and an exit manifold 81 at the outlet of the magnet. The entry manifold 80 includes an access cover 84, shown open in the drawing. Manifold 80 connects with a vacuum beam guide which extends along the curved path within the magnet, communicating at the outlet of the magnet with the exit manifold 81. In this way, a vacuum path through the magnet can be provided for the ribbon beam, while the magnet yoke and windings are in atmosphere.

The inlet and outlet manifolds 80 and 81 provide respective field clamps 82 and 83. The field clamps 82 and 83 comprise ferromagnetic plates extending laterally from the beam path in order to "clamp" the magnetic field generated by the bending magnet and prevent these magnetic fields extending upstream of the beam above the beam inlet 80, or downstream along the beam below the exit manifold 81. The beam clamps 82 and 83 extend inside the respective manifolds 80 and 81 providing a beam aperture for the beam to pass into and out of the magnet. Part of the beam clamp 82 is shown folded back on the interior face of the access cover 84 of the entry manifold 80. The complete beam clamps 82 and 83 are illustrated schematically in FIG. 12.

Figure 13:
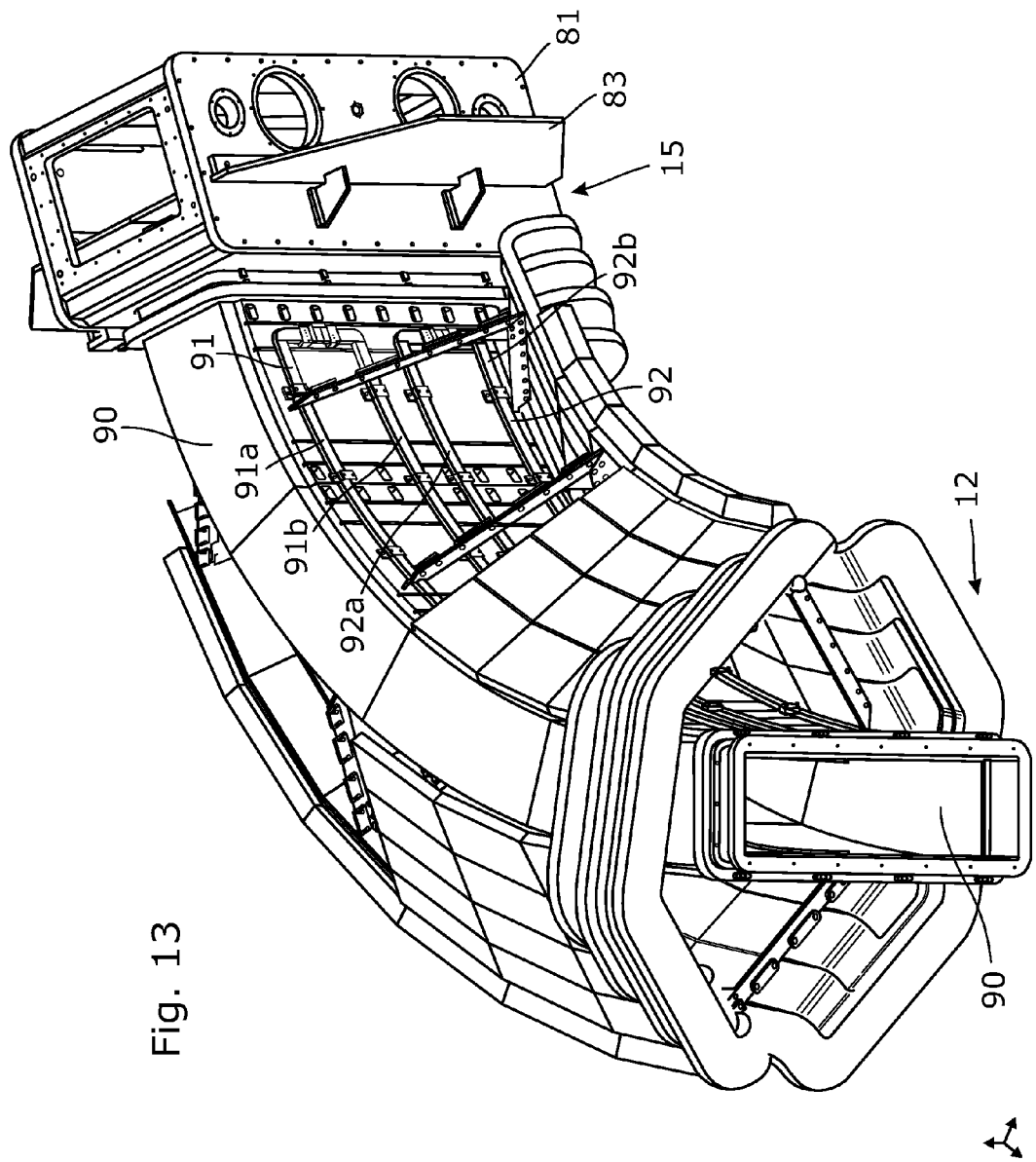
FIG. 13 is a perspective view of the bending magnet of FIG. 11 with parts removed to show underlying elements of the structure.

FIG. 13 is a further view of the beam bending magnet corresponding to the view of FIG. 11, but with the entry manifold 80 removed, and also with three of the upper segments 60 and 62 of the yoke removed. In addition, the saddle coil units 65, 66, 67 and 68 are broken away from the center of the magnet to the outlet, in order to reveal the internal structure.

It may also be noted that the top plates 61 of the yoke are removed in the view of FIG. 13, revealing the internal vacuum beam guide 90 extending from the inlet 12 of the magnet to the outlet 15. The vacuum beam guide 90 has rectangular cross-section and extends vertically between the top plates 61 of the magnet yoke and the corresponding bottom plates. The guide tube is dimensioned to accommodate the ribbon beam and provides the required vacuum enclosure for the ion beam. The guide tube 90 communicates at the inlet of the magnet with the entry manifold 80 (FIG. 11), and at the outlet of the magnet with the exit manifold 81.

Lateral trim coils 91, 92 are shown fastened to the radially inner surface of the beam guide 90, extending substantially the whole way from the inlet of the beam guide to the outlet thereof. Corresponding trim coils are provided attached to the radially outer surface of the beam guide. As can be seen, the trim coils are mounted inside the ferromagnetic yoke and extend adjacent the curved path of the ion beam through the magnet. The trim coils are energizable to produce a trimming magnetic field at locations along the curved beam path effective to reduce distortion of the cross-sectional profile of the ribbon-shaped ion beam caused by aberrations of the magnetic bending field.

Aberrations caused by the fringing fields at the inlet and outlet of the magnet may have the effect of distorting the cross-sectional profile of the ribbon-shaped beam which exits the magnet. This has the effect of reducing the resolving power of the magnet in combination with the mass resolving slit through which the ribbon beam passes to reject unwanted ion species from the beam. The trim coils 91 and 92 can be energized to correct this distortion of the ribbon beam profile. The trim coils 91 and 92 may be energized to provide a sextupole field within the vacuum beam guide 90 sufficient to correct the distortion aberration caused by the inlet and outlet fringing fields of the magnet. As shown in FIG. 13, upper trim coil 91 has an upper conductor element 91a and a lower conductor element 91b extending parallel to the beam path. Similarly, lower trim coil 92 has upper conductor element 92a and lower conductor element 92b extending parallel to the beam path. The trim coils 91 and 92 are arranged symmetrically on opposite sides of the median plane of the magnet, corresponding to the x-axis in FIG. 4. Referring to FIG. 4, the arrangement of currents flowing in the upper and lower conductor elements 91a, 91b and 92a, 92b of the trim coils 91 and 92 is illustrated by way of example. Trim coils on the outer radial side of the vacuum beam guide 90 are energized similarly to provide currents as illustrated at 93a, 93b and 94a, 94b in FIG. 4. The effect of the currents in the trim coils as illustrated in FIG. 4 is to increase the bending curvature of beam ions towards the center of the ribbon (low values of y) and reduce the curvature of beam ions towards the edges of the ribbon (high values of y positive and negative).

Other current configurations may be applied to the trim coils as required to reduce aberrations and optimize the shape of the ribbon beam emerging from the bending magnet.

In addition to the trim coils 91 and 92, aberrations can be corrected by adjusting the relative currents flowing in the different saddle coil units 65, 66, 67 and 68 forming the main bending field of the magnet. By adjusting the relative currents in the saddle coil units of the windings, the nominally uniform magnetic field within the bending magnet can be judiciously distorted in order to compensate for aberrations introduced by fringing fields at the inlet and outlet of the magnet. It should be understood that references herein, to the electrical windings associated with the ferromagnetic yoke providing a desirable uniform magnetic field to bend the ribbon-shaped beam, should be understood in the context of such potential distortion of these magnetic fields in order to correct unwanted aberrations.

In an exemplary embodiment, the bending magnet has a maximum pole gap between the top and bottom of the vacuum guide tube 90 within the yoke of the magnet of 1500 mm. The total bend angle provided by the magnet is about 70°. The magnetic field required to bend the desired ion beam along the curved beam path through the magnet can be calculated from the magnetic rigidity of the required beam. With such a structure, a ribbon-shaped ion beam can be bent and mass selected and emerge from the mass resolving slit of the magnet with a maximum ribbon width of about 1350 mm. Assuming the ribbon beam is collimated, this implies a maximum dimension e of the ribbon beam impinging on the substrate or panel to be implanted of about 1350 mm. Accordingly, the largest size of panel which can be uniformly implanted with the ribbon beam has a dimension no greater than 1350 mm.

FIGS. 14 to 17 illustrate modifications of the ion beam bending magnet adapted to produce a ribbon beam footprint on a substrate or panel to be implanted which has a large dimension slightly greater than the maximum width of ribbon beam emerging from the ion beam bending magnet described previously. The enhancement is provided by slightly compressing the large dimension (y dimension) of the ribbon beam entering the magnet and then arranging for a slight divergence along the major dimension (in y) of the ribbon beam ions emerging from the magnet. As a result of this divergence in the y direction of the ribbon beam, the footprint of the ribbon beam on the substrate or panel to be implanted can have a correspondingly greater dimension l so that larger panels and substrates can be implanted.

Figure 14:
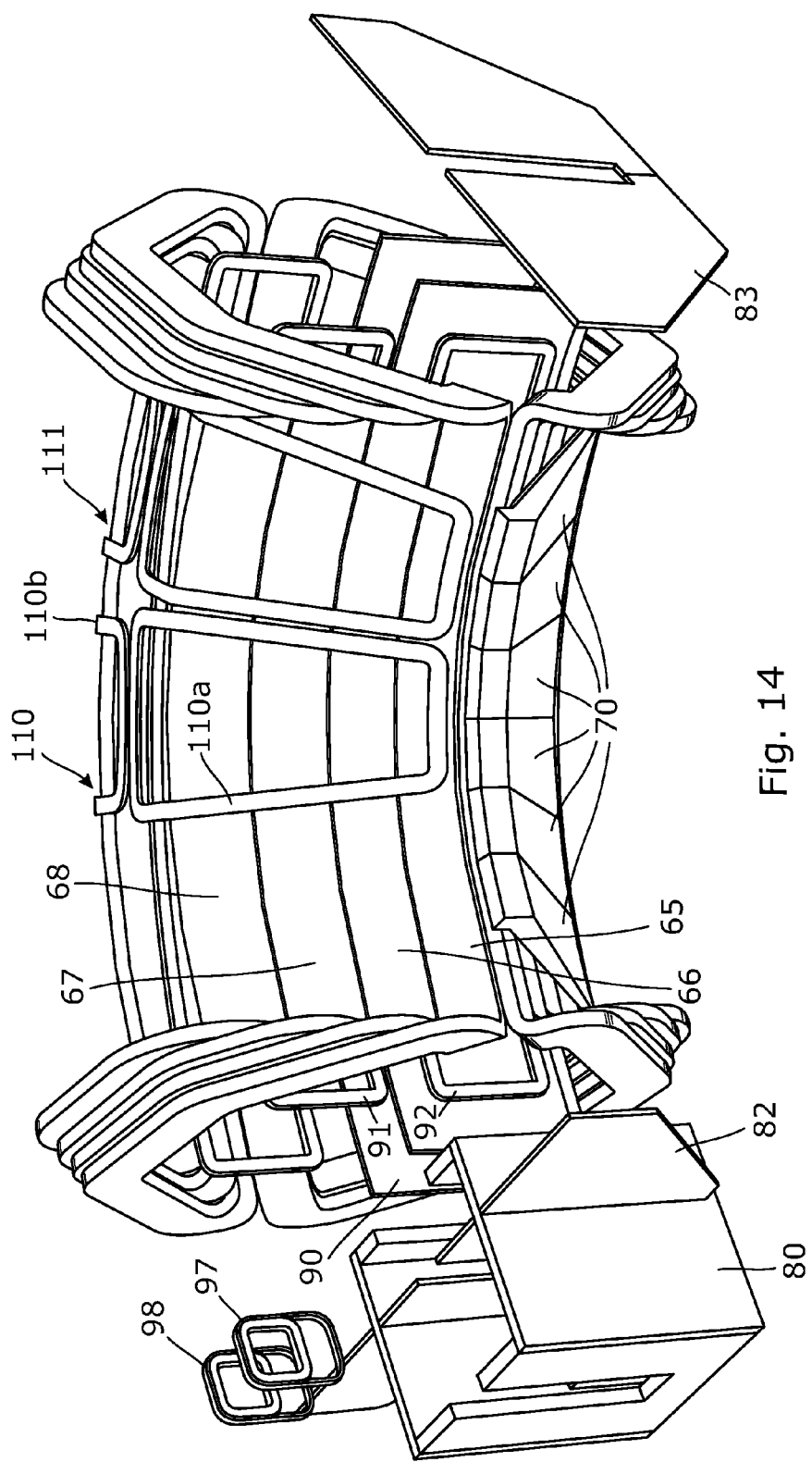
FIG. 14 is a further schematic view of an embodiment of the bending magnet with additional quadrupole coil structures.
Figure 15:
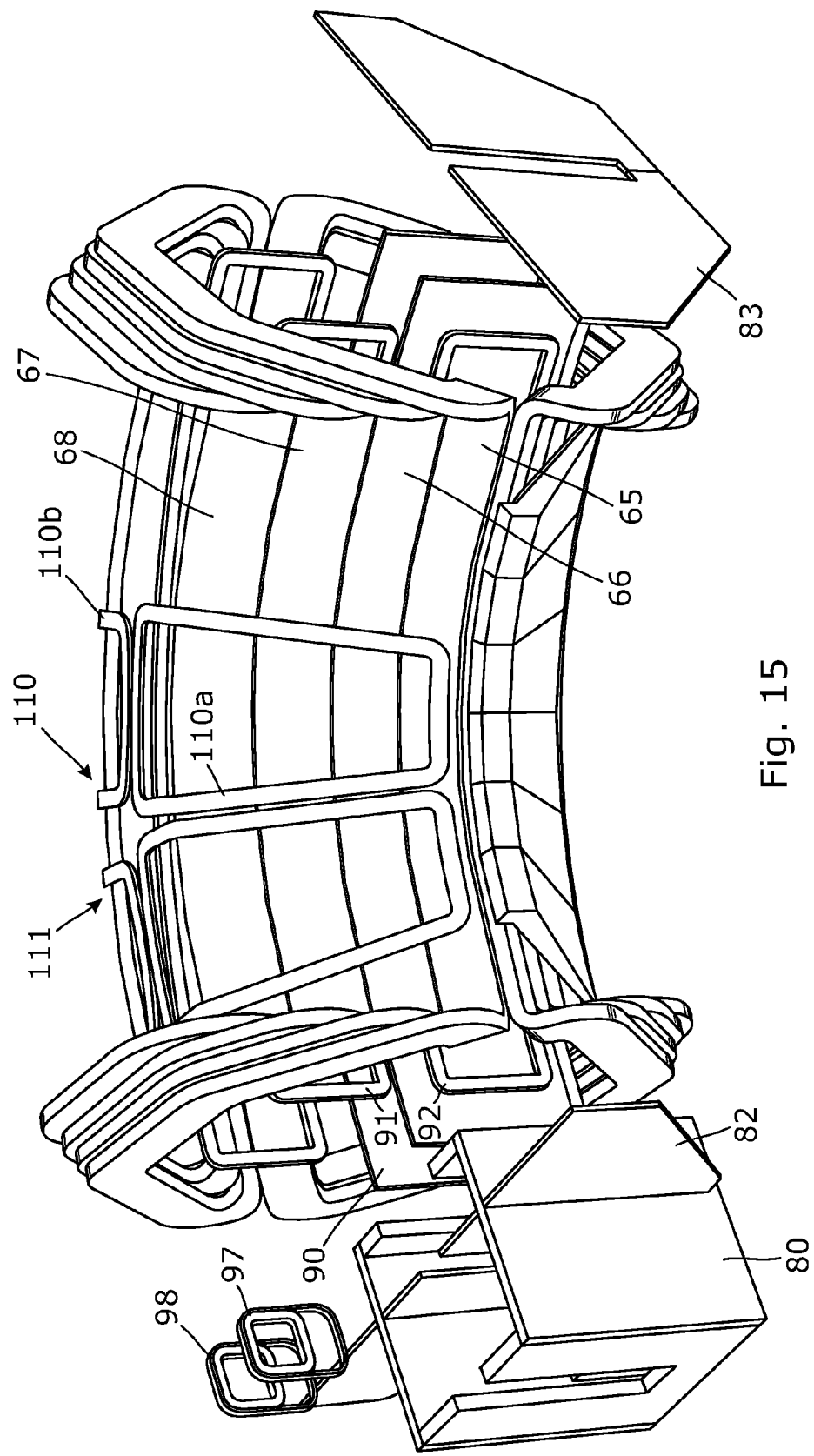
FIG. 15 is a view corresponding to FIG. 14 of a further embodiment with quadrupole coil structures.

FIGS. 14 and 15 are views of the ion beam bending magnet corresponding to the view of FIG. 12, but with the yoke structure above the waiste or median plane of the magnet, removed to reveal fully the four nested saddle coil units 65, 66, 67 and 68. In addition, the upper half, above the median plane, of the internal vacuum beam guide 90 is removed in FIGS. 14 and 15. Also, the upper halves above the median plane of the entry manifold 80, as well as the upper half above the median plane of the field clamps 82 and 83, are all removed. In addition, the exit manifold 81 is removed completely, again for clarity.

Figure 16:
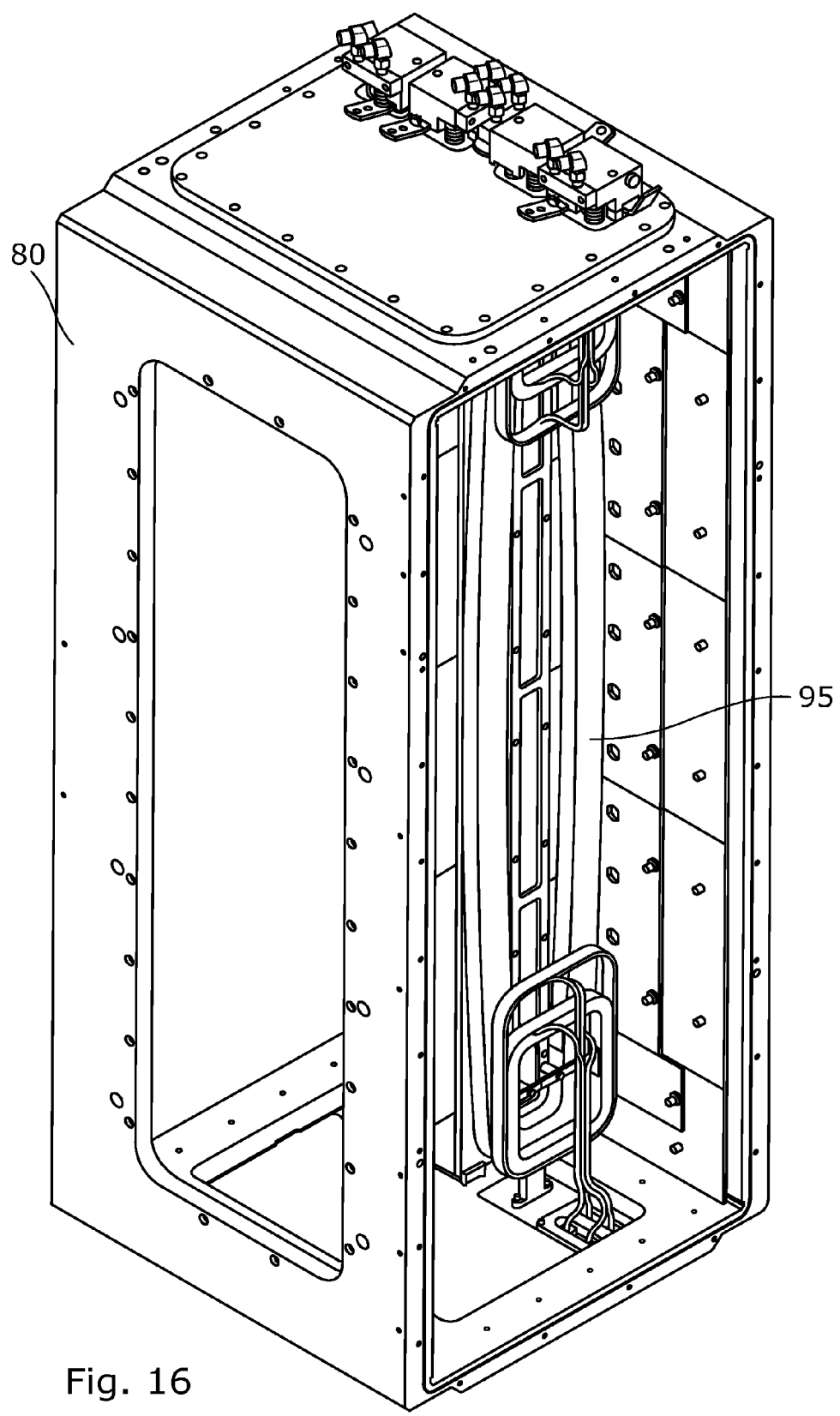
FIG. 16 is a perspective view of an entry manifold for the beam bending magnet embodying the present invention, incorporating a steering coil assembly and quadrupole focusing coils.
Figure 17:
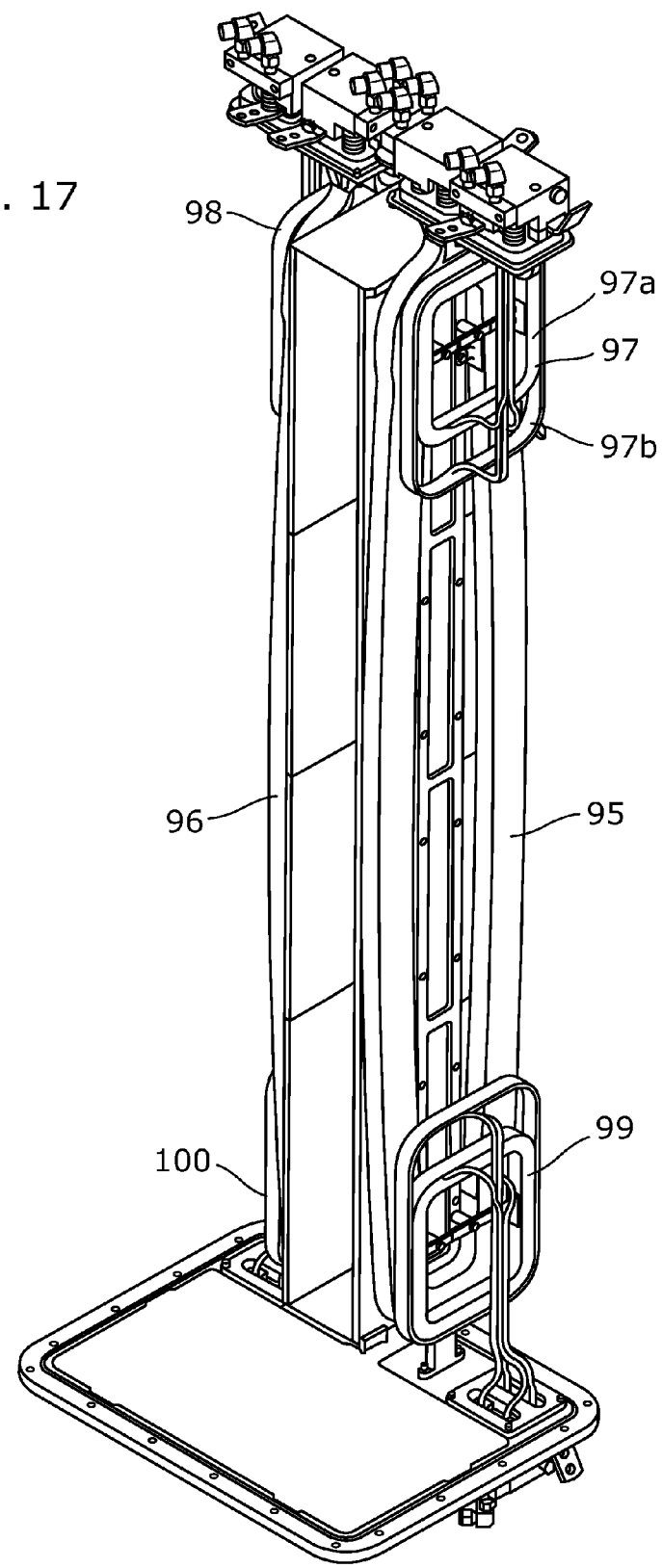
FIG. 17 is a view of the coil assembly within the entry manifold of FIG. 16.

The entry manifold 80 is illustrated in greater detail in FIG. 16 and FIG. 17 illustrates a coil structure contained within the entry manifold 80. Considering FIGS. 16 and 17 first, the entry manifold 80 contains a pair of steering coils 95 and 96. Steering coils 95 and 96 in the entry manifold 80 are long narrow windings arranged in parallel planes so as to be on opposite sides of a ribbon-shaped beam passing through the entry manifold 80 into the bending magnet. In operation, the steering coils 95 and 96 are energized with currents in the same sense so as to produce a magnetic field extending transversely, generally normal to the plane of the ribbon beam. The steering coils can, therefore, be used to provide a desired amount of vertical deflection (in the y direction) of the ribbon beam. This vertical steering of the ribbon beam, effectively in the plane of the ribbon, can be useful for controlling the precise location of the ribbon beam footprint on a substrate or panel to be implanted in the process chamber 18 of the ion implanter. In this way, the steering coils 95 and 96 can be used where necessary to compensate for problems of thermal expansion and misalignment effects that may occur between the ion source aperture and the first extraction electrode at the ion source, which control the initial trajectory of the ion beam. The magnetic field produced by the steering coils 95 and 96 is essentially dipolar.

The entry manifold 80 also contains quadrupole windings, comprising coil assemblies 97, 98, 99 and 100 (best seen in FIG. 17). Each quadrupole coil assembly comprises an inner winding located at one extremity of the ribbon beam, and a slightly larger outer winding 97b which extends further towards the center line of the ribbon beam. The coil assemblies 97 and 98 are energized with current flowing in the same direction, to produce a magnetic field transversely across the top edge of the ribbon beam, which is arranged to provide controllable deflection of beam ions near the upper edge of the ribbon beam downwards towards the center line of the beam. Similarly, the coil assemblies 99 and 100 are energized with currents with a polarity opposite to the currents energizing coil assemblies 97 and 98, in order to provide a transverse magnetic field across the lower edge of the ribbon beam which tends to deflect ions upwards towards the center line of the beam. The inner and outer windings of each coil assembly are energized in the same direction in order to provide a desired variation of transverse magnetic field.

With the quadrupole coil assemblies 97, 98, 99 and 100, the upper and lower edges of the ribbon beam can be controllably deflected (focused) towards the center line of the ribbon beam, so as slightly to reduce the large dimension of the ribbon beam entering the bending magnet.

Referring again to FIG. 14, first and second quadrupole coil assemblies 110 and 111 are provided overlying the saddle coil units 65, 66, 67 and 68, as illustrated. The first quadrupole coil assembly 110 comprises a respective substantially planar coil winding 110a, 110b arranged to be aligned with each of the four angled internal yoke surfaces, corresponding to the angled lines 28, 29, 30 and 31 of the yoke internal profile as illustrated in FIG. 4. In FIG. 14, only two (110a and 110b) of the four windings forming the quadrupole coil assembly 110 are visible. Corresponding windings are also provided against the lower inclined yoke surfaces of the magnet.

In the embodiment of the ion beam bending magnet that has been described previously, the angled surfaces formed by the yoke are each at 45° to the x-axis, corresponding to the horizontal in the described embodiment. In order to provide a quadrupole magnetic field within the portion of the vacuum beam guide 90 passing between the windings of the quadrupole coil assembly 110, the windings of the coil assembly 110 are energized with polarities to produce a substantially transverse field that generates an upwards deflection in the upper part of the ribbon beam and a downwards deflection in the lower part. Since neighboring windings (e.g. 110a and 110b) of the assembly 110 are at 90° to each other (because of the 45° angle of the yoke sides to the vertical), the resulting coil structure provides a nominal quadrupole field within the vacuum beam guide 90. As is well known to those skilled in the art, a quadrupole field has the effect of focusing ions passing through the field in one direction normal to the beam direction, and defocusing ions in the orthogonal direction normal to the beam direction. The quadrupole coil assembly 110 is energized so as to provide defocusing of the beam ions in the y direction, that is in the direction of the large dimension of the ribbon beam, and focusing in the x direction, that is in the direction of the small dimension of the ribbon beam. Since the ribbon beam extends a relatively short distance in the x direction, corresponding to the thickness of the ribbon beam, the x direction focusing is small in magnitude, compared to the y direction defocusing, but can help to reduce the ribbon beam thickness allowing improved mass resolution at the mass resolving slit 17.

The second quadrupole coil assembly 111 has the same structure as the first assembly 110 and is energized with the same polarity, so as to provide further y defocusing of the ion beam.

As a result of the quadrupole coil assemblies 110 and 111, the ribbon beam leaving the bending magnet can have a controlled amount of divergence in the y direction, that is in the plane of the ribbon of the beam. In practice, the quadrupole coil assemblies 110 and 111 may be energized to provide up to about 5° of beam divergence in the y direction. As a result, the footprint of the ribbon beam on a substrate or panel to be implanted can be larger than the width of ribbon beam which can be accommodated through the vacuum beam guide 90 of the bending magnet. In the absence of the quadrupole coil structures 110 and 111, together with the entry quadrupole coil assemblies 97-100, a bending magnet with a vacuum beam guide 90 having a maximum dimension of about 1500 mm can provide a collimated ribbon beam of about 1350 mm. With the quadrupole coil assemblies described in relation to FIGS. 14-17, the diverging ribbon beam produced from the bending magnet can provide a beam footprint on a substrate or panel to be implanted of at least 1500 mm. As a result, the implanter can be used for implanting panels having a dimension of 1500 mm.

In FIG. 14, the first quadrupole coil assembly 110 is located midway along the length of the beam bending magnet, approximately half way between the inlet and outlet of the magnet. The second quadrupole coil unit 111 is provided adjacent the first unit 110 towards the outlet end of the magnet. FIG. 15 illustrates an alternative arrangement in which the second quadrupole coil assembly 111 is located adjacent the central assembly 110, but towards the inlet end of the magnet. In the arrangements of both FIG. 14 and FIG. 15, the two quadrupole coil assemblies 110 and 111 are energized to work in unison, providing an extended region of quadrupole field, providing defocusing in the y direction. By locating the two quadrupole coil assemblies 110 and 111 nearer the inlet of the magnet, as shown in FIG. 15, the maximum divergence angle of ions in the beam at the point of implantation into the substrate or panel can be slightly reduced.

In the embodiments described above, the angled side faces of the yoke structure of the bending magnet extend substantially to a median plane of the bending magnet (where y=0) so as substantially to form a ridge with the adjacent angled side surface below the median plane. Referring to FIG. 10, this is equivalent to saying that the angled sides 40 and 41 at x=b on the x-axis, and also that the sides 42 and 43, meet at x=−b on the x-axis (y=0) as shown in the Figure. In another embodiment, the angled sides 40 and 41 (in FIG. 10) both terminate at a point where x=x'<b, and be joined by a vertical line (parallel to the y-axis) 55. Similarly, sides 42 and 43 could terminate where x=−x'>−b and be interconnected by a vertical line 56. The resulting yoke has four angled internal faces corresponding to the remaining truncated lengths of angled sides 40, 41, 42 and 43, top and bottom faces as before corresponding to the top 45 and bottom 46 of the sectional profile of FIG. 10, and also vertical side faces corresponding to the vertical lines 55 and 56.

In such a structure, the coil windings should have conductors parallel to the beam path adjacent the angled internal faces of the yoke, providing the same uniform current per unit distance along the angled lines 40, 41, 42 and 43, as with the previously described embodiment. However, coil windings parallel to the beam path should also be provided adjacent the vertical side faces corresponding to vertical lines 55 and 56. These coil windings adjacent the vertical side faces of the yoke should carry the same total current as would be carried by the conductors adjacent the angled faces in the previously described embodiment at locations on the angled faces outside the vertical side faces 55 and 56, i.e. for values of x greater than x' (and less than −x'). It can then be seen that the truncation of the angled faces 40, 41, 42 and 43 at the side walls 55 and 56 of the yoke structure has no effect on the magnetic field produced within the interior space of the yoke.

In the description of the invention and the embodiments above, the ferromagnetic yoke has been described as having a uniform cross-sectional internal profile along the path length of the ion beam through the magnet. In practice, the ferromagnetic yoke may be made up of segments, such as segments 60 and 70 shown in FIGS. 11 and 12. Although the segments are shaped so as to provide the required curved profile overall along the length of the magnet, each segment may have a substantially flat internal face. As a result the internal cross-sectional profile of the yoke need not be precisely uniform along the length of the ion beam path through the magnet. References to "uniform" in this context should be understood to include such small variation in the cross-sectional profile.

The foregoing detailed description has described only a few of the many forms that this invention may take. For this reason the detailed description is intended by way of illustration and not by way of limitation. It is only the following claims, including all equivalents, which are intended to define the scope of the invention.

The invention claimed is:

1. An ion beam bending magnet having an ion beam inlet, an ion beam outlet and a curved path through the magnet for an ion beam, said curved path having a path length between said beam inlet and said beam outlet, said curved path bending monotonically in an ion beam bending plane and having a curved central beam axis, said magnet being adapted to accommodate and bend along said curved beam path, a ribbon-shaped ion beam having a cross-sectional profile with a major dimension normal to said bending plane;

the magnet comprising a ferromagnetic yoke surrounding said curved beam path along said path length, said ferromagnetic yoke defining a uniform cross-sectional internal profile along said path length in respective planes normal to said curved central beam axis, said uniform cross-sectional internal profile being defined in Cartesian (x,y) co-ordinates having an origin at said central beam axis, an x-axis extending in said ion beam bending plane and a y-axis normal to said bending plane; and electrical windings associated with said ferromagnetic yoke, arranged to generate a magnetic bending field within said yoke across said curved path to bend a ribbon-shaped beam of ions having a desired mass/charge ratio along said curved path;

wherein said uniform cross-sectional internal profile has sides including four angled sides respectively lying on lines defined by the four equations:

$$a_1x + b_1y = a_1b_1, \quad\quad 1)$$

$$a_2x - b_1y = a_2b_1, \quad\quad 2)$$

$$a_3x + b_2y = -a_3b_2, \quad\quad 3)$$

$$a_4x - b_2y = -a_4b_2; \quad\quad 4)$$

where $a_1$, $a_2$, $a_3$, $a_4$, $b_1$ and $b_2$ are positive numbers, wherein each of said angled sides lying on the lines defined by equations 1) and 4) extends on the respective said line up to y=y', and each of said angled sides lying on the lines defined by equations 2) and 3) extends on the respective said line down to y=−y", where both y' and y" are positive, y' is less than or equal to the smaller of $a_1$ and $a_4$, and y" is less than or equal to the smaller of $a_2$ and $a_3$.

2. An ion beam bending magnet as claimed in claim 1, wherein $b_2/a_4 = \tan\theta_1$, $b_1/a_1 = \tan\theta_2$, $b_2/a_3 = \tan\theta_3$, and $b_1/a_2 = \tan\theta_4$.

and each of $\theta_1$, $\theta_2$, $\theta_3$, and $\theta_4$ is greater than or equal to 20° and less than or equal to 60°.

3. An ion beam bending magnet as claimed in claim 2, wherein
$\tan\theta_1/\tan\theta_3 = \tan\theta_2/\tan\theta_4$.

4. An ion beam bending magnet as claimed in claim 3, wherein
$\theta_2 = \theta_4$ and $\theta_1 = \theta_3$.

5. An ion beam bending magnet as claimed in claim 4, wherein $\theta_1 = \theta_2$.

6. An ion beam bending magnet as claimed in claim 5, wherein $\theta_1 = 45°$.

7. An ion beam bending magnet as claimed in claim 1, wherein said uniform cross-sectional internal profile has a top and a bottom in addition to said four angled sides, and said top and bottom are parallel to the x-axis.

8. An ion beam bending magnet as claimed in claim 7, wherein said top and said bottom have respective lengths $c_1$ and $c_2$, where each of $c_1$ and $c_2$ is less than or equal to $(b_1+b_2)/2$.

9. An ion beam bending magnet as claimed in claim 8, wherein each of $c_1$ and $c_2$ is less than or equal to $(b_1+b_2)/4$.

10. An ion beam bending magnet as claimed in claim 1, wherein said ferromagnetic yoke has four angled internal surfaces which respectively correspond to said four angled sides of said uniform cross-sectional internal profile, and said electrical windings comprise axial conductor elements extending adjacent said yoke angled internal surfaces parallel to said curved central beam axis between said inlet and said outlet of said magnet, said conductor elements being arranged to provide a uniform number of said conductor elements per unit distance along each of said four angled sides of said cross-sectional profile.

11. An ion beam bending magnet as claimed in claim 10, wherein each of said four sides of said uniform cross-sectional internal profile of said yoke extends between a respective waist end where |x| is maximum and |y| is minimum and a respective apex end where |x| is a minimum and |y| is a maximum, and wherein said yoke has a cross-sectional thickness normal to the respective angled internal surface which reduces from a maximum at said waist ends of said sides to a minimum at said apex ends of said sides.

12. An ion beam bending magnet as claimed in claim 10, wherein said electrical windings comprise at least one pair of saddle coil units.

13. An ion beam bending magnet as claimed in claim 12, wherein each said saddle coil unit comprises a first plurality of said axial conductor elements arranged side-by-side in a first axial row parallel to a first one of said yoke surfaces which is inside said curved beam path, a second plurality of said axial conductor elements arranged side-by-side in a second axial row parallel to a second one of said yoke internal surfaces which is outside said curved beam path, a first plurality of linking conductor elements connecting said axial conductor elements of said first and second axial rows adjacent said inlet of the magnet, and a second plurality of linking conductor elements connecting said axial conductor elements of said first and second axial rows adjacent said outlet of the magnet.

14. An ion beam bending magnet as claimed in claim 13, wherein said linking conductor elements of said first plurality are arranged side-by-side in a first radial row lying in a respective first radial plane normal to said central beam axis at said inlet of said magnet, and said linking conductor elements of said second plurality are arranged side-by-side in a second radial row lying in a respective second radial plane normal to said central beam axis at said outlet of said magnet.

15. An ion beam bending magnet as claimed in claim 14, wherein each of said axial conductor elements, in each of said first and second axial rows, bends outwards through 90° perpendicularly to the respective adjacent one of said first and second yoke internal surfaces, to connect to a respective one of said linking conductor elements.

16. An ion beam bending magnet as claimed in claim 13, wherein said electrical windings comprise a plurality of pairs of said saddle coil units, respective said rows of said axial conductors of each of said pairs of saddle coil units extending over respective parts of each of said yoke internal surfaces.

17. An ion beam bending magnet as claimed in claim 16, wherein the conductor elements of said windings are water-cooled tubular elements, and the saddle coil units of each of said plurality of pairs have a respective number of coil turns selected to equalize a total length of conductor in each of said units.

18. An ion beam bending magnet as claimed in claim 6, wherein said ferromagnetic yoke has four internal surfaces which respectively correspond to said four sides of said uniform cross-sectional internal profile, and the magnet further includes;

at least a first set of magnetic quadrupole field windings located between said inlet and said outlet of the magnet and comprising a respective coil loop located against each of said four inner surfaces, and a first energizing supply for said first set of quadrupole field windings.

19. An ion beam bending magnet as claimed in claim 18, including a second magnetic quadrupole field winding set located in front of said inlet of said magnet, and a second energizing supply for said second quadrupole field winding set operative to apply y-direction focusing to at least edges of a ribbon-shaped ion beam entering said magnet.

20. An ion beam bending magnet as claimed in claim 19, wherein said first energizing supply is operative to apply y-direction defocusing to said ion beam as said beam travels through said magnet.

21. An ion beam bending magnet as claimed in claim 1, further including trim coils mounted inside said ferromagnetic yoke, extending adjacent said curved path and energizable to produce a trimming magnetic field at locations along said curved beam path effective to reduce distortion of said cross-sectional profile of said ribbon-shaped ion beam caused by said magnetic bending field.

* * * * *